US012712521B2

(12) United States Patent
Doll et al.

(10) Patent No.: US 12,712,521 B2
(45) **Date of Patent: *Aug. 18, 2026**

(54) MICROELECTROMECHANICAL RESONATOR

(71) Applicant: SiTime Coporation, Santa Clara, CA (US)

(72) Inventors: Joseph C. Doll, Mountain View, CA (US); Nicholas Miller, Sunnyvale, CA (US); Charles I. Grosjean, Los Gatos, CA (US); Paul M. Hagelin, Saratoga, CA (US); Ginel C. Hill, Sunnyvale, CA (US)

(73) Assignee: SiTime Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/991,596

(22) Filed: Dec. 22, 2024

(65) Prior Publication Data

US 2025/0239989 A1 Jul. 24, 2025

Related U.S. Application Data

(60) Continuation of application No. 18/412,732, filed on Jan. 15, 2024, now Pat. No. 12,218,647, which is a
(Continued)

(51) Int. Cl.
*H03H 9/125* (2006.01)
*H03H 3/007* (2006.01)
(Continued)

(52) U.S. Cl.
CPC .......... *H03H 9/125* (2013.01); *H03H 3/0077* (2013.01); *H03H 9/02259* (2013.01);
(Continued)

(58) Field of Classification Search
CPC ............... H03H 9/125; H03H 9/02259; H03H 9/02401; H03H 9/02448; H03H 9/1057;
(Continued)

(56) References Cited

U.S. PATENT DOCUMENTS 4,011,149 A 3/1977 Nozik
4,143,393 A 3/1979 DiMaria et al.
(Continued)

FOREIGN PATENT DOCUMENTS

WO 2005025057 A2 3/2005
WO 2011042597 A1 4/2011
WO 2012110708 A1 8/2012

OTHER PUBLICATIONS

Bachelet et al., "Structural-energy calculations based on norm-conserving pseudopotentials and localized Gaussian orbitals", Physical Review B, vol. 24, No. 8, pp. 4745-4752, Oct. 1981.
(Continued)

*Primary Examiner* — Jeffrey M Shin

(57) ABSTRACT

A moveable micromachined member of a microelectromechanical system (MEMS) device includes an insulating layer disposed between first and second electrically conductive layers. First and second mechanical structures secure the moveable micromachined member to a substrate of the MEMS device and include respective first and second electrical interconnect layers coupled in series, with the first electrically conductive layer of the moveable micromachined member and each other, between first and second electrical terminals to enable conduction of a first joule-heating current from the first electrical terminal to the second electrical terminal through the first electrically conductive layer of the moveable micromachined member.

20 Claims, 20 Drawing Sheets

Related U.S. Application Data continuation of application No. 17/847,438, filed on Jun. 23, 2022, now Pat. No. 11,916,534, which is a division of application No. 17/544,120, filed on Dec. 7, 2021, now Pat. No. 11,677,379, which is a division of application No. 16/245,184, filed on Jan. 10, 2019, now Pat. No. 11,228,298, which is a division of application No. 15/497,146, filed on Apr. 25, 2017, now Pat. No. 10,218,333, which is a division of application No. 15/186,510, filed on Jun. 19, 2016, now Pat. No. 9,712,128, which is a continuation-in-part of application No. 14/617,753, filed on Feb. 9, 2015, now Pat. No. 9,705,470.

(60) Provisional application No. 62/183,689, filed on Jun. 23, 2015, provisional application No. 62/181,767, filed on Jun. 19, 2015, provisional application No. 61/937,601, filed on Feb. 9, 2014.

(51) Int. Cl.
*H03H 3/02* (2006.01)
*H03H 9/02* (2006.01)
*H03H 9/10* (2006.01)
*H03H 9/15* (2006.01)
*H03H 9/17* (2006.01)
*H03H 9/24* (2006.01)

(52) U.S. Cl.
CPC .... *H03H 9/02401* (2013.01); *H03H 9/02448* (2013.01); *H03H 9/1057* (2013.01); *H03H 9/17* (2013.01); *H03H 9/2463* (2013.01); *H03H 2003/027* (2013.01); *H03H 2009/02181* (2013.01); *H03H 2009/02307* (2013.01); *H03H 2009/155* (2013.01)

(58) Field of Classification Search
CPC ........ H03H 9/17; H03H 9/2463; H03H 3/077; H03H 2003/027; H03H 2009/02181; H03H 2009/02307; H03H 2009/155
See application file for complete search history.

(56) References Cited

U.S. PATENT DOCUMENTS 4,924,135 A 5/1990 Pinkahsov
6,325,848 B1 12/2001 Watanabe
7,202,761 B2 4/2007 Lutz et al.
7,369,003 B2 5/2008 Hagelin
7,369,004 B2 5/2008 Partridge et al.
7,439,658 B2 10/2008 Aratake
7,443,258 B2 10/2008 Hagelin
7,446,619 B2 11/2008 Partridge et al.
7,446,620 B2 11/2008 Partridge et al.
7,545,228 B1 6/2009 Lu et al.
7,586,239 B1 9/2009 Li et al.
7,639,104 B1 12/2009 Quevy et al.
8,410,868 B2 4/2013 Schoepf
8,558,643 B2 10/2013 Prunnila et al.
8,633,635 B1 1/2014 Pan
8,786,166 B2 7/2014 Jaakkola et al.
8,916,407 B1 12/2014 Grosjean
8,916,942 B2 12/2014 Pensala et al.
9,071,226 B2 6/2015 Jaakkola et al.
9,705,470 B1 7/2017 Doll et al.
9,712,128 B2 7/2017 Doll
9,774,313 B1 9/2017 Grosjean
10,218,333 B2 2/2019 Doll
10,263,596 B2 4/2019 Doll et al.
10,476,477 B1 11/2019 Grosjean
10,892,733 B2 1/2021 Doll et al.
11,909,376 B2 2/2024 Doll et al.
12,095,447 B1 9/2024 Grosjean
12,166,464 B2 12/2024 Doll et al.
12,218,647 B2 * 2/2025 Doll .................... H03H 3/0077
2003/0184412 A1 10/2003 Gorrell
2005/0195050 A1 9/2005 Lutz et al.
2005/0242904 A1 11/2005 Lutz et al.
2006/0261915 A1 11/2006 Lutz et al.
2007/0120625 A1 5/2007 Larson et al.
2007/0262831 A1 11/2007 Van Beek et al.
2009/0153258 A1 6/2009 Lutz et al.
2009/0158566 A1 6/2009 Hagelin et al.
2010/0107736 A1 5/2010 Lu et al.
2010/0127596 A1 5/2010 Ayazi et al.
2010/0127798 A1 5/2010 Ayazi
2010/0327701 A1 12/2010 Grannen et al.
2011/0266925 A1 11/2011 Ruby et al.
2011/0305120 A1 12/2011 Hessler et al.
2012/0013412 A1 1/2012 Winkler et al.
2012/0132003 A1 5/2012 Comi et al.
2012/0230159 A1 9/2012 Hessler et al.
2012/0286903 A1 11/2012 Prunnila et al.
2013/0106246 A1 5/2013 Raieszadeh et al.
2013/0285676 A1 10/2013 Rahafrooz et al.
2016/0096763 A1 4/2016 Aimone et al.
2016/0099702 A1 4/2016 Jaakkola et al.
2016/0099703 A1 4/2016 Jaakkola et al.
2016/0099704 A1 4/2016 Jaakkola et al.
2017/0194968 A1 7/2017 Yonezawa
2024/0056054 A1 2/2024 Grosjean

OTHER PUBLICATIONS

Bruner et al., "Electronic Effect in the Elastic Constants of Germanium", Physical Review Letters, vol. 7, No. 2, pp. 55-56, Jul. 1961.
Cerdeira et al., "Effect of Carrier Concentration on the Raman Frequencies of Si and Ge", Physical Review B, vol. 5, No. 4, pp. 1440-1454, Feb. 1972.
Csavinszky et al., "Effect of Doping on the Elastic Constants of Silicon", Physical Review, vol. 132, No. 6, pp. 2434-2440 Dec. 1963.
ECN Magazine, "World's First MEMS Real Time Clock," Nov. 29, 2010, 4 pages.
EE Times, "Built-in MEMS resonators beat quartz," Nov. 30, 2010, 3 pages.
Einspruch et al., "Electronic Effect in the Elastic Constant C' of Silicon", Applied Physics Letters, vol. 2, No. 1, pp. 1-3, Jan. 1963.
European Patent Office, International Search Report and Written Opinion of International Searching Authority in International Application No. PCT/US2016/038275, Nov. 2, 2016, 19 pages.
Frangi, Attilio et al., "Interface dissipation in piezoelectric MEMS resonators: an experimental and numerical investigation," Sensors, 2013 IEEE, Nov. 3-6, 2013, Baltimore, MD, pp. 1-4, ISSN: 1930-0395.
Hall, "Electronic Effects in the Elastic Constraints of n-Type Silicon", Physical Review, vol. 161, No. 3, pp. 756-761, Sep. 1967.
Hammond et al., "Intertial Transducer Design for Manufacturability and Performance at Motorola," 12th International Conference on Transducers, Solid-State Sensors, Actuators and Microsystems, 2003, Piscataway, NJ, USA, IEEE, Jun. 8, 2003, pp. 85-90, vol. 1.
Hao, Zhili et al., "An analytical study on interfacial dissipation in piezoelectric rectangular block resonators with in- plane longitudinal-mode vibrations," available online Aug. 21, 2015, Elsevier Sensors and Actuators A 163 (2010), pp. 401-409.
Harrison, "Pseudopotential theory of covalent bonding", Physical Review B, vol. 14, No. 2, pp. 702-711, Jul. 1976.
Hopcroft et al., "What is the Young's Modulus of Silicon?", Journal of Microelectromechanical Systems, vol. 19, No. 2, pp. 229-238, Apr. 2010.
Hung, Li-Wen et al., "Capacitive-Piezoelectric Transducers for High-Q Micromechanical AlN Resonators," Journal of Microelectromechanical Systems, vol. 24, No. 2, Apr. 2015, pp. 458-473.
Jaakkola, Antti et al. Experimental Determination of the Temperature Dependency of the Elastic Constants of Degenerately Doped Silicon, 2013 Joint UFFC, EFTF and PFM Symposium, pp. 421-424, IEEE.

(56) References Cited

OTHER PUBLICATIONS

Kaajakari, "Silicon as an anisotropic mechanical material—a tutorial", http://www. kaajakarl.net/-ville/research/tutorials/ tutorials.shtml, pp. 1-5.
Keyes, "Density of States of Degenerate n-Type Silicon from Elastic Constants", Solid State Communications, vol. 32, No. 2, pp. 179-180; 1979.
Keyes, "Elastic Properties of Diamond-Type Semiconductors", Journal of Applied Physics, vol. 33, No. 11, pp. 3371-3372, Nov. 1962.
Kim, "Electronic effect on the elastic constant C44 of n-type silicon", J. Appl. Phys., vol. 52, No. 5, pp. 3693-3695, May 1981.
Kourani, Ali et al., "A 76.8 MHz temperature compensated MEMS reference oscillator for wireless handsets," available online Apr. 20, 2015, Elsevier Microelectronics Journal 46 (2015), pp. 496-505.
Lee, Hyung Kyu et al., "Electrostatic Tuning to Achieve Higher Stability Microelectromechanical Composite Resonators," IEEE Journal of Microelectromechanical Systems, vol. 20, No. 6, Dec. 2011, pp. 1355-1365.
Matsuda, Satoru et al., "Correlation Between Propagation Loss and Silicon Dioxide Film Properties for Surface Acoustic Wave Devices," IEEE Transactions on Ultrasonics, Ferroelectrics, and Frequency Control, vol. 60, No. 5, May 2013, pp. 993-997.
McSkimin, "Measurement of Elastic Constants at Low Temperatures by Means of Ultrasonic Waves-Data for Silicon and Germanium Single Crystals, and for Fused Silica", Journal of Applied Physics, vol. 24, No. 8, pp. 988-997, Aug. 1953.
Melamud, Renata et al., "Temperature-Insensitive Composite Micromechanical Resonators," IEEE Journal of Microelectromechanical Systems, vol. 18, No. 6, Dec. 2009, pp. 1409-1419.
Nelson, Andrew et al., A 48 MHZ, Hermetic, 0.48 mm2 Chip-Scale Packaged USB3.0 Oscillator Integrating an FBAR Resonator with CMOS Circuitry, 2011 IEEE International Ultrasonics Symposium Proceedings, pp. 1226-1229.
Pan, Wanling et al. "Thin-Film Piezoelectric-On-Substrate Resonators With Q Enhancement and Tcf Reduction," Micro Electro Mechanical Systems (MEMS), 2010 IEEE 23rd International Conference, Jan. 24-28, 2010, Wanchai, Hong Kong, pp. 727-730, ISSN: 1084-6999.
Pensala et al., "Temperature Compensation of Silicon MEMS Resonators by Heavy Doping", Ultrasonics Symposium (IUS), 2011 IEEE International, pp. 1952-1955, Oct. 2011.
Popa, Laura C. et al., "2DEG Electrodes for Piezoelectric Transduction of AIGaN/GaN MEMS Resonators," European Frequency and Time Forum & International Frequency Control Symposium (EFTF/IFC), 2013 Joint, Jul. 21-25, 2013, Prague, pp. 922-925, IEEE.
Pourkamali, Siavash; "High Frequency Capacitive Single Crystal Silicon Resonators and Coupled Resonator Systems," Dissertation at Georgia Institute of Technology; Dec. 2006.
Rodriguez et al., "Structural properties of tetrahedrally coordinated crystals from first-principles calculations of pressure and total energies" Physical Review B, vol. 31, No. 8, pp. 5327-5334, Apr. 1985.
Ruby, Rich, "Positioning FBAR Technology in the Frequency and Timing Domain," Frequency Control and the European Frequency and Time Forum (FCS), 2011 Joint Conference of the IEEE International, San Francisco, CA, May 2-5, 2011, pp. 1-10, ISBN 978-1-61284-111-3.
Samarao et al., "Temperature Compensation of Silicon Micromechanical Resonators Via Degenerate Doping," Electron Devices Meeting (IEDM), 2009 IEEE International, IEEE Piscataway, NJ, USA, Dec. 7, 2009, pp. 1-4.
Samarao, et al., "Temperature Compensation of Silicon Micromechanical Resonators via Degenerate Doping", IEDM, pp. 789-792, Dec. 2009.
Sanchez-Dehesa et al., "Self-consistent calculation of the internal strain parameter of silicon", Physical Review B, vol. 26, No. 10, pp. 5960-5962, Nov. 1982.
Seitner, Maximilian J. et al., "Damping of metallized bilayer nanomechanical resonators at room temperature," Sep. 22, 2014, University of Konstanz, Department of Physics, 78457 Konstanz, Germany, pp. 1-17.
Smith et al., "Reevaluation of the derivatives of the half order Fermi integrals", J. Appl. Phys., vol. 73, No. 11, pp. 7030-7034, Jun. 1993.
Van Camp et al. "First Principles Calculation of Ground State and Electronic Properties of C and Si", Physica Scripta, vol. 35, pp. 706-709; 1987.
Villanueva, L.G. et al., "Interface Losses in Multimaterial Resonators," Mems 2014, San Francisco, CA, USA, Jan. 26-30, 2014, pp. 632-635, IEEE.
White, Jr. B.E. et al., "Internal Friction of Subnanometer a-Si02 Films," The American Physical Society, Physical Review Letters, vol. 75, No. 24, Dec. 11, 1995, pp. 4437-4439.

* cited by examiner

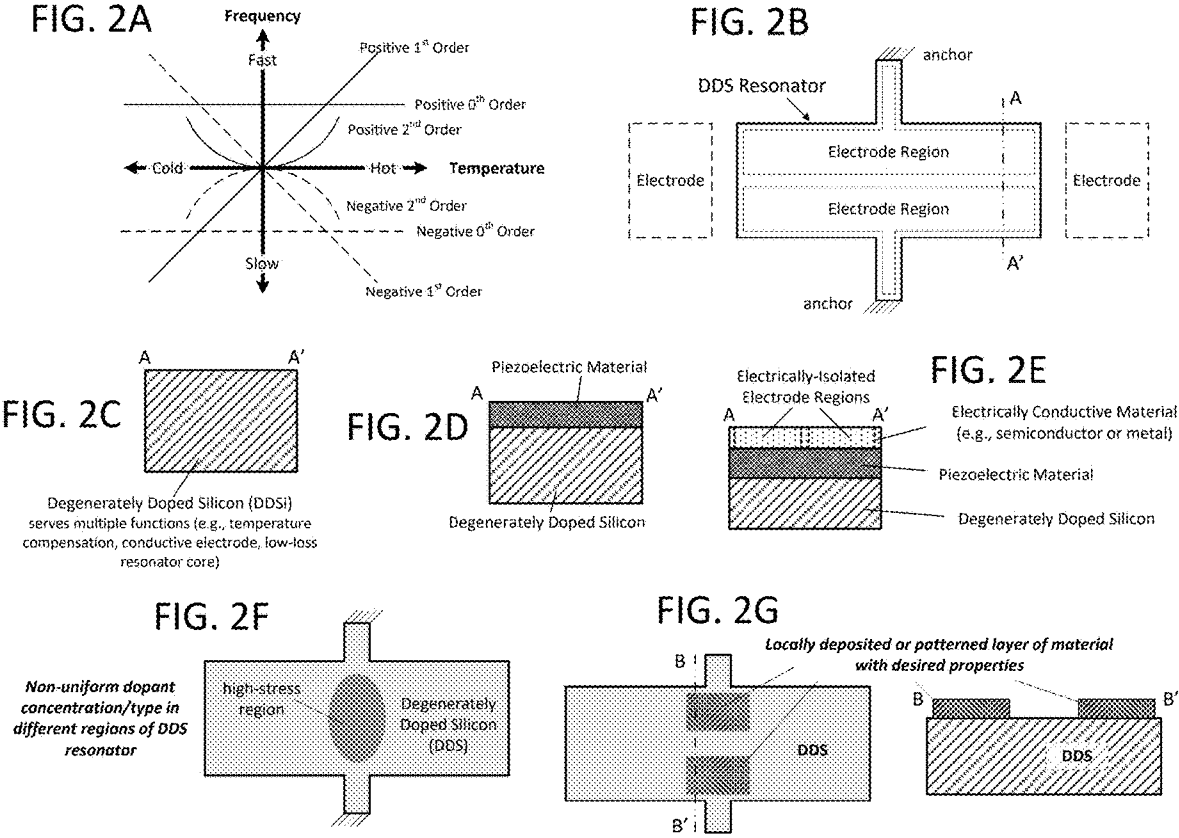
FIG. 2A
Frequency
Fast
Slow
Cold
Hot
Temperature
Positive 1st Order
Positive 0th Order
Positive 2nd Order
Negative 2nd Order
Negative 0th Order
Negative 1st Order
FIG. 2B
anchor
DDS Resonator
A
A'
Electrode
Electrode Region
Electrode Region
Electrode
anchor
FIG. 2C
A
A'
Degenerately Doped Silicon (DDSi)
serves multiple functions (e.g., temperature compensation, conductive electrode, low-loss resonator core)
FIG. 2D
Piezoelectric Material
A
A'
Degenerately Doped Silicon
FIG. 2E
Electrically-Isolated Electrode Regions
A
A'
Electrically Conductive Material (e.g., semiconductor or metal)
Piezoelectric Material
Degenerately Doped Silicon
FIG. 2F
Non-uniform dopant concentration/type in different regions of DDS resonator
high-stress region
Degenerately Doped Silicon (DDS)
FIG. 2G
Locally deposited or patterned layer of material with desired properties
B
B'
DDS
B
B'
DDS

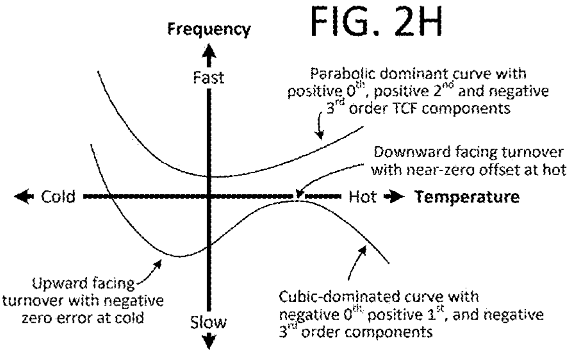
FIG. 2H
Frequency
Fast
Slow
Cold
Hot
Temperature
Parabolic dominant curve with positive 0th, positive 2nd and negative 3rd order TCF components
Downward facing turnover with near-zero offset at hot
Upward facing turnover with negative zero error at cold
Cubic-dominated curve with negative 0th, positive 1st, and negative 3rd order components

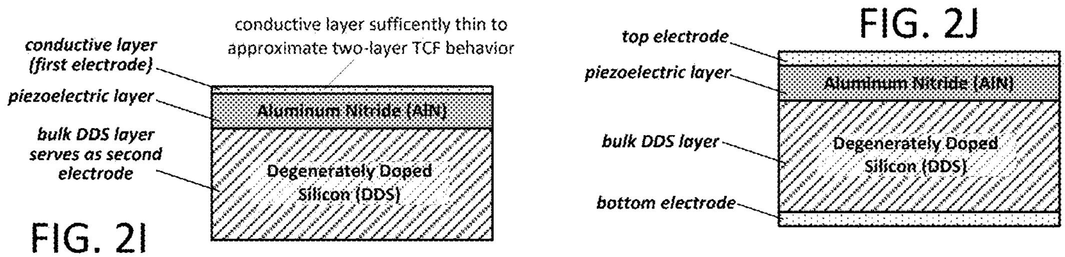
conductive layer sufficently thin to approximate two-layer TCF behavior
conductive layer (first electrode)
piezoelectric layer
bulk DDS layer serves as second electrode
Aluminum Nitride (AlN)
Degenerately Doped Silicon (DDS)
FIG. 2I
FIG. 2J
top electrode
piezoelectric layer
bulk DDS layer
bottom electrode
Aluminum Nitride (AlN)
Degenerately Doped Silicon (DDS)

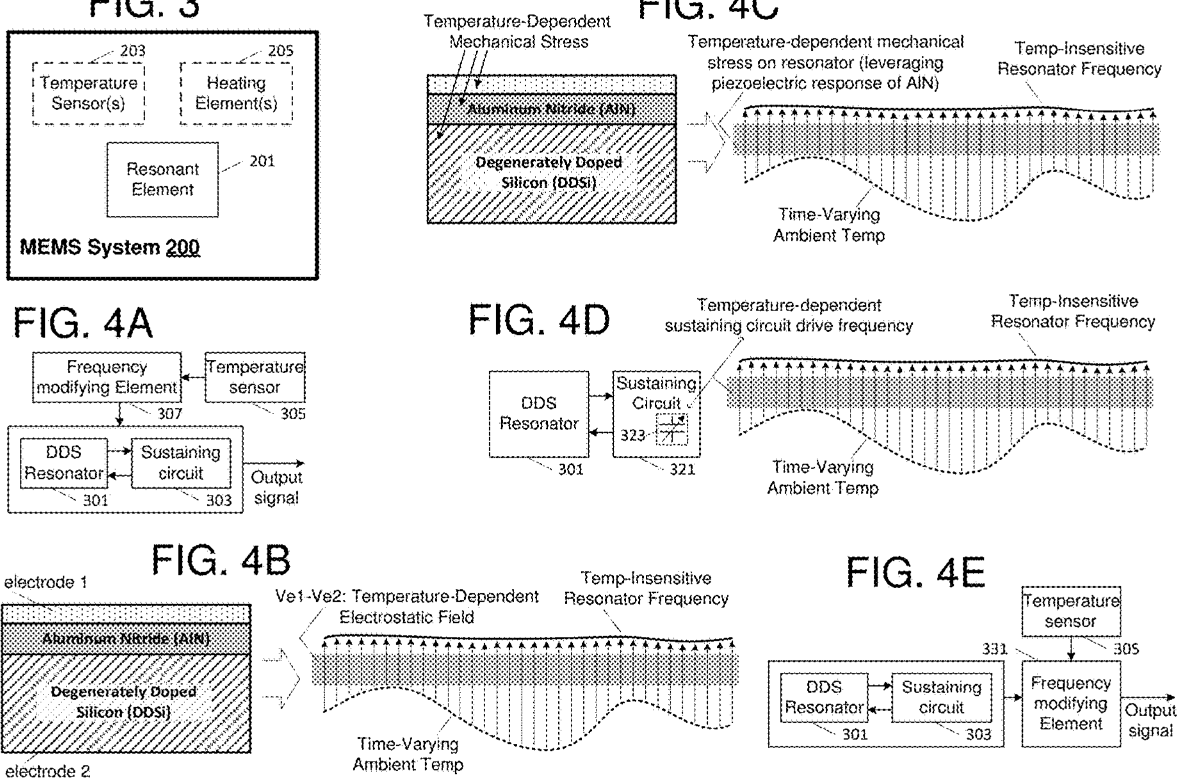
FIG. 3
203
205
Temperature Sensor(s)
Heating Element(s)
Resonant Element
201
MEMS System 200
FIG. 4A
Frequency modifying Element
Temperature sensor
307
305
DDS Resonator
Sustaining circuit
Output signal
301
303
FIG. 4B
electrode 1
Aluminum Nitride (AlN)
Degenerately Doped Silicon (DDSi)
electrode 2
Ve1-Ve2: Temperature-Dependent Electrostatic Field
Temp-Insensitive Resonator Frequency
Time-Varying Ambient Temp
FIG. 4C
Temperature-Dependent Mechanical Stress
Aluminum Nitride (AlN)
Degenerately Doped Silicon (DDSi)
Temperature-dependent mechanical stress on resonator (leveraging piezoelectric response of AlN)
Temp-Insensitive Resonator Frequency
Time-Varying Ambient Temp
FIG. 4D
Temperature-dependent sustaining circuit drive frequency
Temp-Insensitive Resonator Frequency
DDS Resonator
Sustaining Circuit
323
301
321
Time-Varying Ambient Temp
FIG. 4E
Temperature sensor
331
305
DDS Resonator
Sustaining circuit
Frequency modifying Element
Output signal
301
303

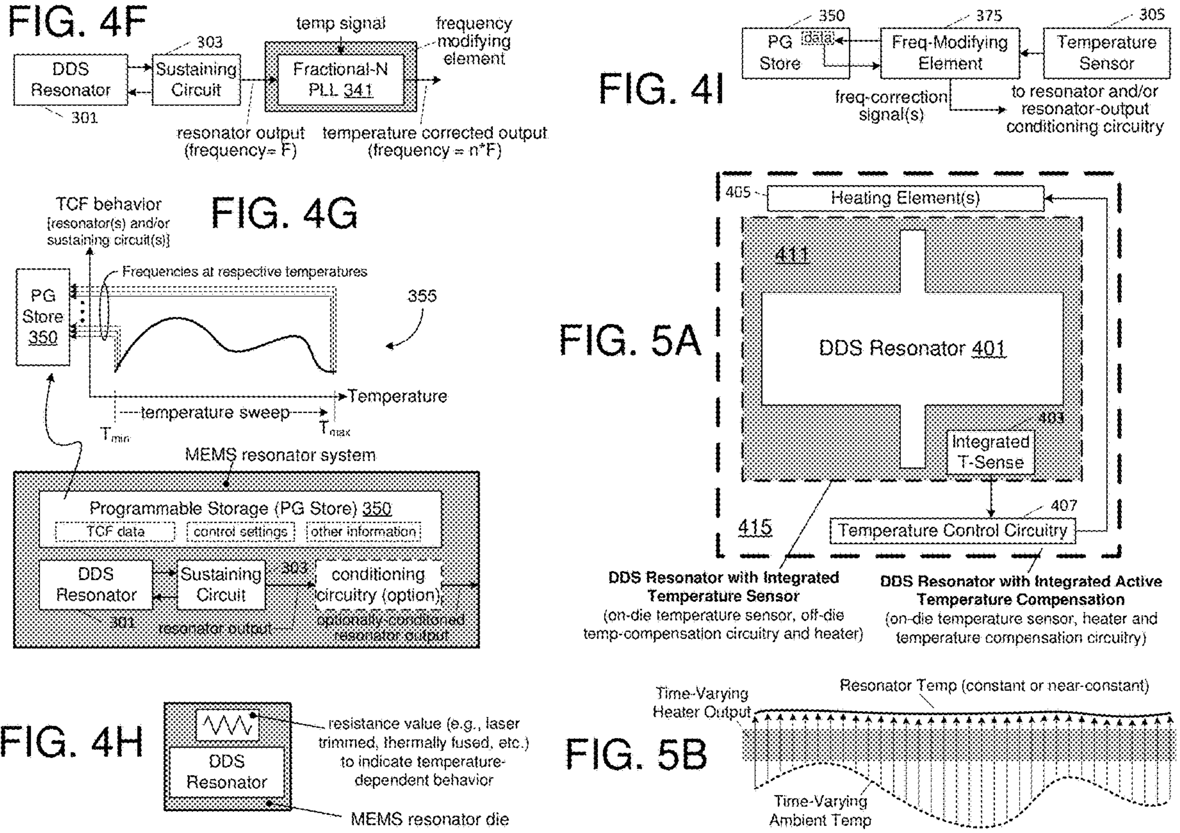
FIG. 4F
DDS Resonator
301
Sustaining Circuit
303
temp signal
Fractional-N PLL 341
frequency modifying element
resonator output (frequency= F)
temperature corrected output (frequency = n*F)
FIG. 4I
350
PG Store
data
375
Freq-Modifying Element
305
Temperature Sensor
freq-correction signal(s)
to resonator and/or resonator-output conditioning circuitry
FIG. 4G
TCF behavior
[resonator(s) and/or sustaining circuit(s)]
Frequencies at respective temperatures
PG Store 350
355
Temperature
temperature sweep
T min
T max
MEMS resonator system
Programmable Storage (PG Store) 350
TCF data
control settings
other information
DDS Resonator
Sustaining Circuit
303
conditioning circuitry (option)
301
resonator output
optionally-conditioned resonator output
FIG. 5A
405
Heating Element(s)
411
DDS Resonator 401
403
Integrated T-Sense
415
407
Temperature Control Circuitry
DDS Resonator with Integrated Temperature Sensor
(on-die temperature sensor, off-die temp-compensation circuitry and heater)
DDS Resonator with Integrated Active Temperature Compensation
(on-die temperature sensor, heater and temperature compensation circuitry)
FIG. 4H
resistance value (e.g., laser trimmed, thermally fused, etc.) to indicate temperature-dependent behavior
DDS Resonator
MEMS resonator die
FIG. 5B
Time-Varying Heater Output
Resonator Temp (constant or near-constant)
Time-Varying Ambient Temp

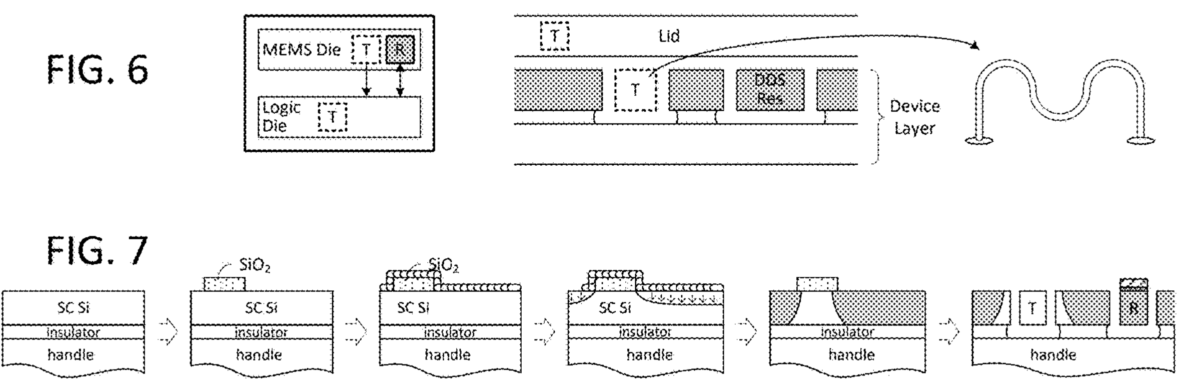
FIG. 6
MEMS Die
T
R
Logic Die
T
Lid
T
DDS Res
Device Layer
FIG. 7
$SiO_2$
SC Si
insulator
handle
T
R
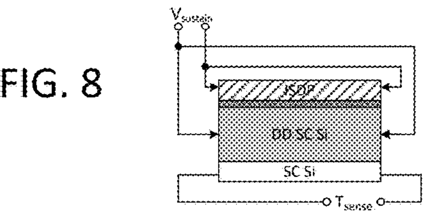
FIG. 8
$V_{sustain}$
JSDP
DD SC Si
SC Si
$T_{sense}$ DDS Resonator 500
Resonator Angle
f
f
Anchor
Spring
Anchor
507a
Crystallographic Axis
504
Resonator
Axis 503
A
High Stress Area
501
trenching
512
Anchor
507b
Anchor
Spring
A
Resonator Body
Field Area 510

Expansion-Phase
Motion
Low Stress
Area
Equi-Stress
Contours
High Stress
Area
Expansion-Phase
Motion
Low Stress
Area

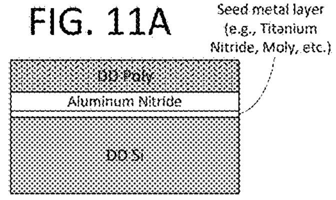
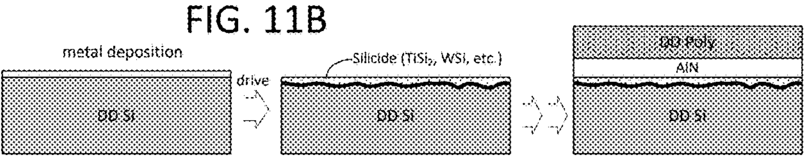
FIG. 12A
4-Stack with Outer Silicon Layers
DD Poly
metal
AlN
DD Si
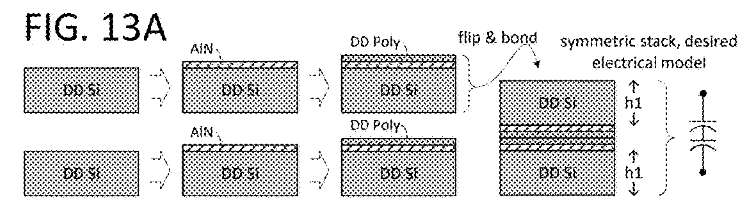
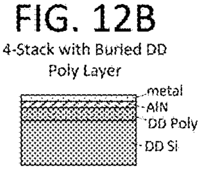
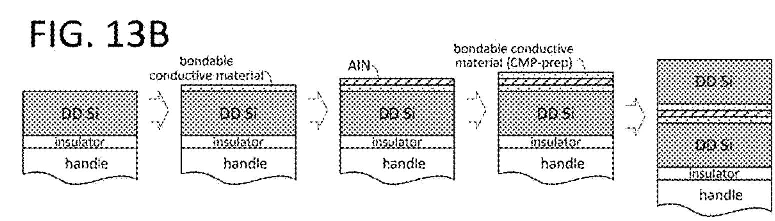

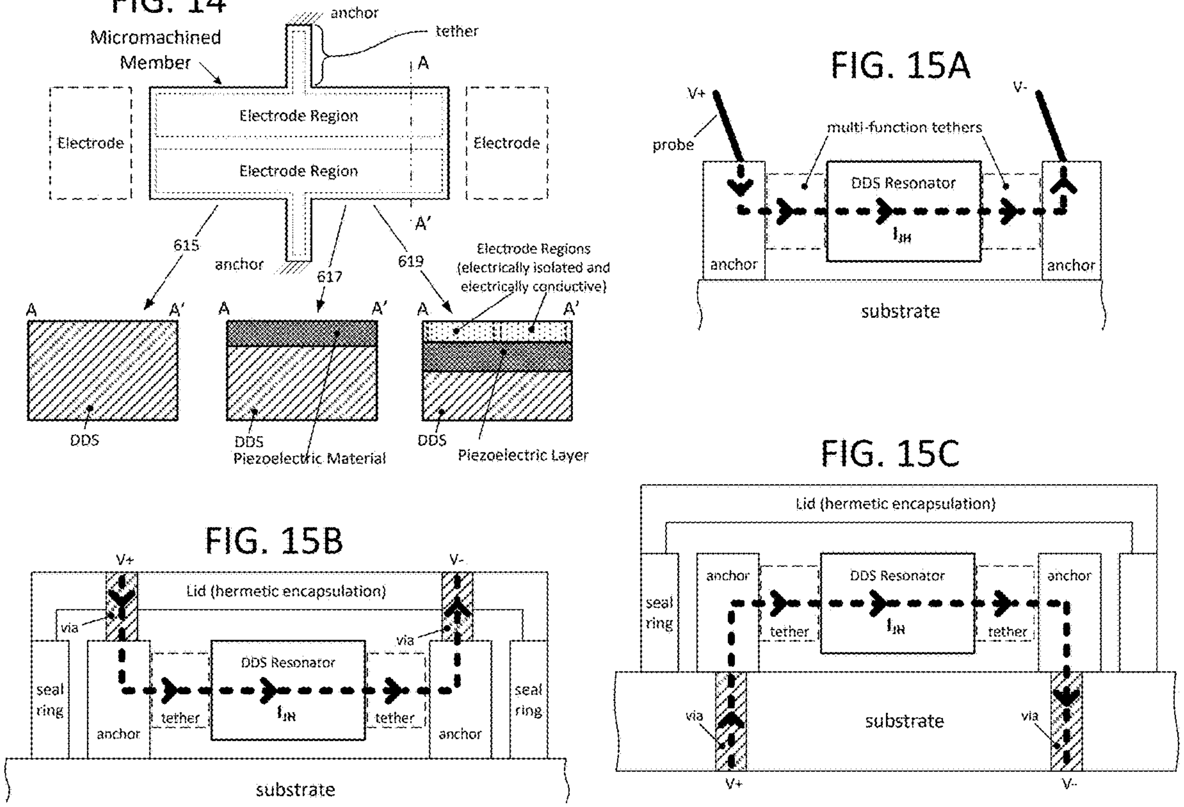
FIG. 14
anchor
tether
Micromachined Member
A
Electrode
Electrode Region
Electrode Region
Electrode
A'
615
anchor
617
619
Electrode Regions (electrically isolated and electrically conductive)
A
A'
A
A'
A
A'
DDS
DDS
Piezoelectric Material
DDS
Piezoelectric Layer
FIG. 15A
V+
V-
probe
multi-function tethers
DDS Resonator
$I_{JH}$
anchor
anchor
substrate
FIG. 15B
V+
V-
Lid (hermetic encapsulation)
via
via
DDS Resonator
seal ring
anchor
tether
$I_{JH}$
tether
anchor
seal ring
substrate
FIG. 15C
Lid (hermetic encapsulation)
anchor
DDS Resonator
anchor
seal ring
tether
$I_{JH}$
tether
via
substrate
via
V+
V-

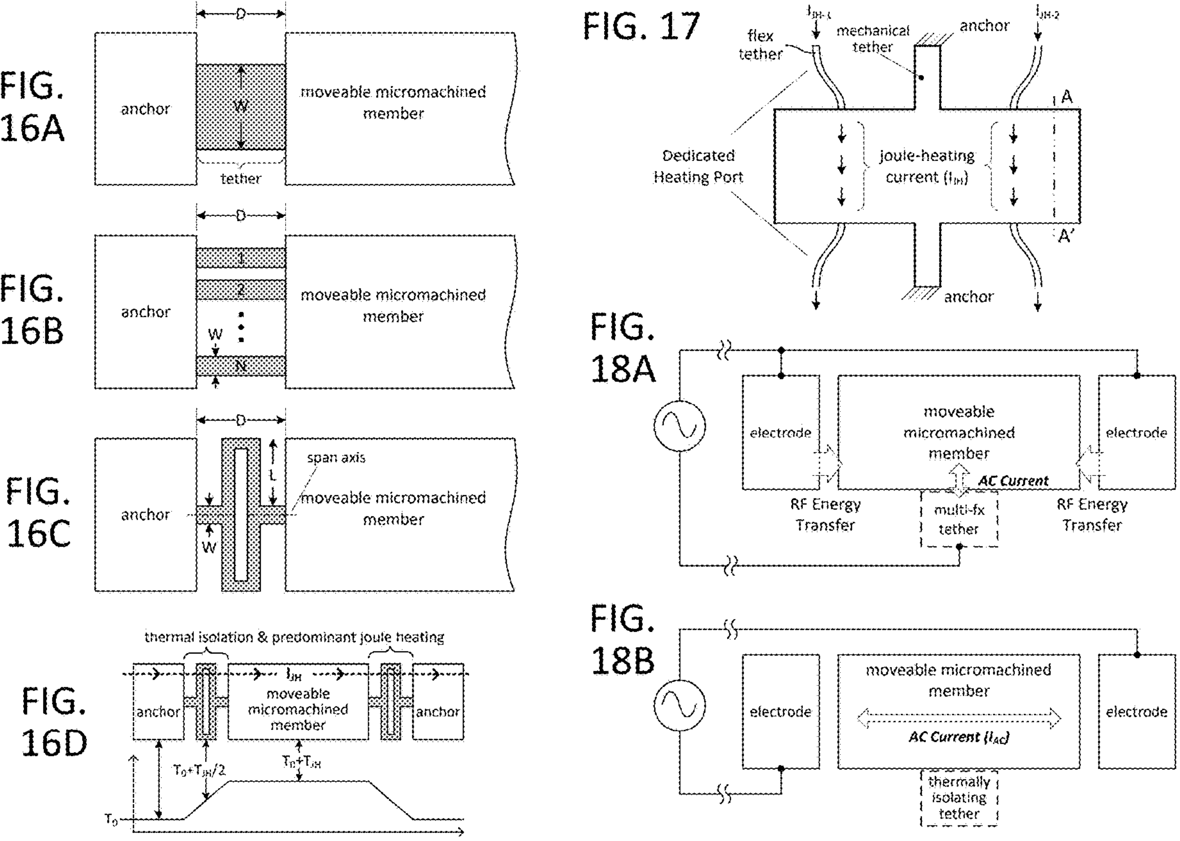
FIG. 16A
anchor
D
W
tether
moveable micromachined member
FIG. 16B
anchor
D
1
2
W
N
moveable micromachined member
FIG. 16C
anchor
D
L
span axis
W
moveable micromachined member
FIG. 16D
thermal isolation & predominant joule heating
anchor
moveable micromachined member
anchor
T0+TJH/2
T0+TJH
T0
FIG. 17
flex tether
mechanical tether
anchor
A
Dedicated Heating Port
joule-heating current (IJH)
A'
anchor
FIG. 18A
electrode
moveable micromachined member
electrode
AC Current
RF Energy Transfer
multi-fx tether
RF Energy Transfer
FIG. 18B
moveable micromachined member
electrode
electrode
AC Current (IAC)
thermally isolating tether

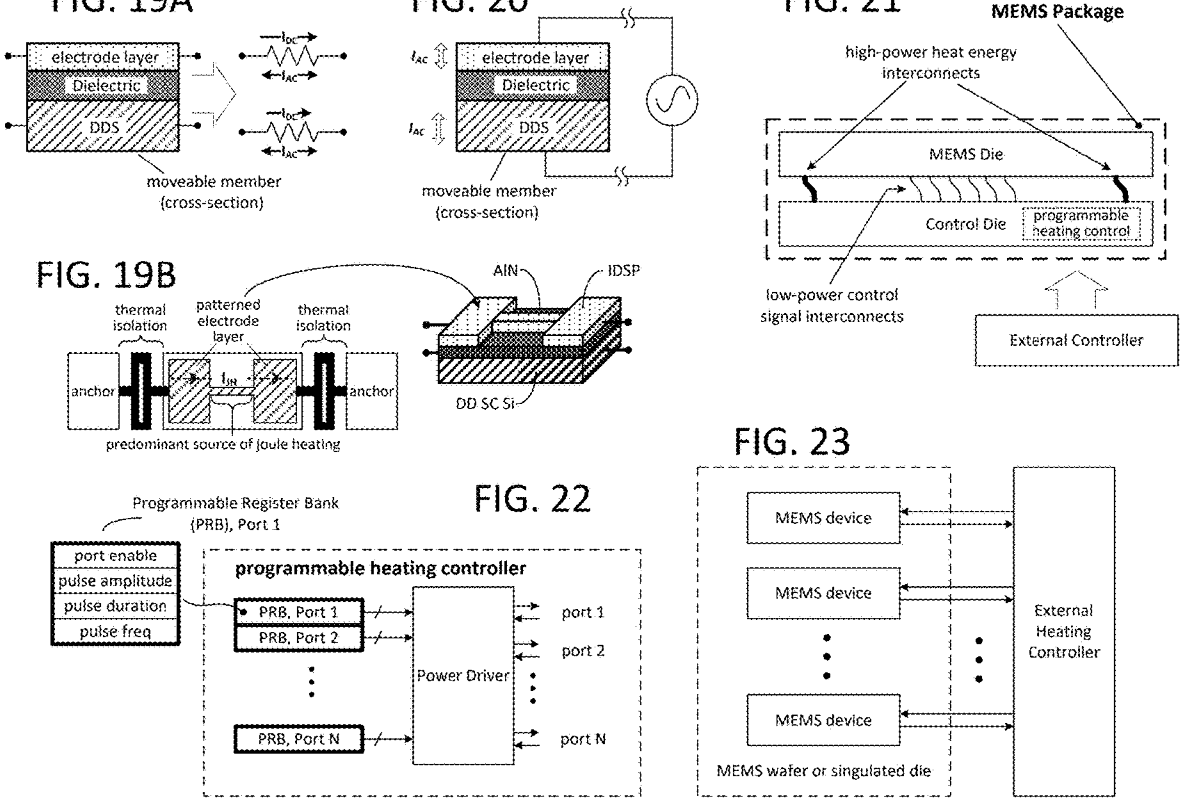
FIG. 19A
electrode layer
Dielectric
DDS
moveable member (cross-section)
FIG. 20
electrode layer
Dielectric
DDS
moveable member (cross-section)
FIG. 21
MEMS Package
high-power heat energy interconnects
MEMS Die
Control Die
programmable heating control
low-power control signal interconnects
External Controller
FIG. 19B
thermal isolation
patterned electrode layer
thermal isolation
anchor
anchor
predominant source of joule heating
AlN
IDSP
DD SC Si
FIG. 23
MEMS device
MEMS device
MEMS device
External Heating Controller
MEMS wafer or singulated die
FIG. 22
Programmable Register Bank (PRB), Port 1
port enable
pulse amplitude
pulse duration
pulse freq
programmable heating controller
PRB, Port 1
PRB, Port 2
PRB, Port N
Power Driver
port 1
port 2
port N

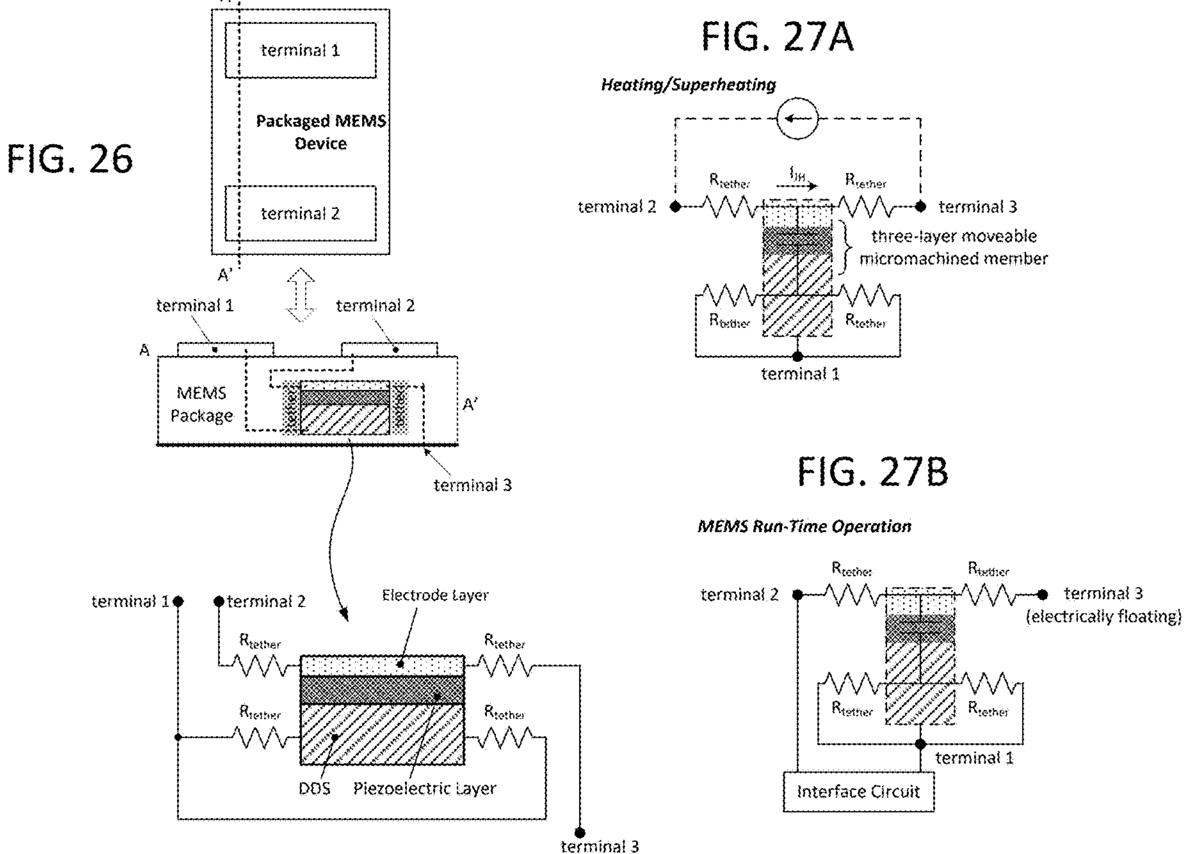
FIG. 26
A
terminal 1
Packaged MEMS Device
terminal 2
A'
terminal 1
terminal 2
A
MEMS Package
A'
terminal 3
terminal 1
terminal 2
Electrode Layer
$R_{tether}$
$R_{tether}$
$R_{tether}$
$R_{tether}$
DOS
Piezoelectric Layer
terminal 3
FIG. 27A
Heating/Superheating
$R_{tether}$
$I_{JH}$
$R_{tether}$
terminal 2
terminal 3
three-layer moveable micromachined member
$R_{tether}$
$R_{tether}$
terminal 1
FIG. 27B
MEMS Run-Time Operation
$R_{tether}$
$R_{tether}$
terminal 2
terminal 3 (electrically floating)
$R_{tether}$
$R_{tether}$
terminal 1
Interface Circuit

FIG. 28A

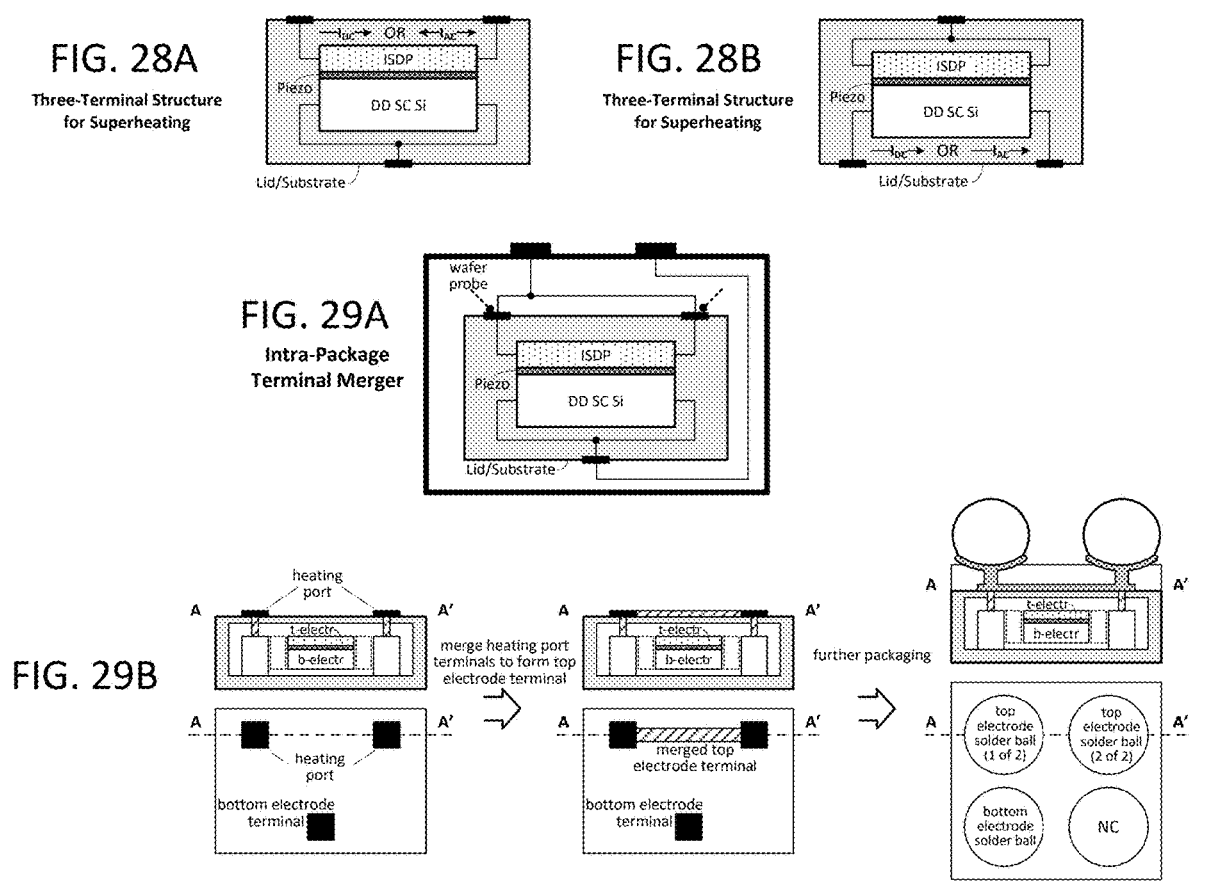

Three-Terminal Structure for Superheating $I_{DC}$ OR $I_{AC}$

ISDP

Piezo

DD SC Si

Lid/Substrate

FIG. 28B

Three-Terminal Structure for Superheating

ISDP

Piezo

DD SC Si $I_{DC}$ OR $I_{AC}$

Lid/Substrate

FIG. 29A

Intra-Package Terminal Merger wafer probe

ISDP

Piezo

DD SC Si

Lid/Substrate

FIG. 29B heating port

A A' t-electr b-electr heating port bottom electrode terminal merge heating port terminals to form top electrode terminal merged top electrode terminal further packaging top electrode solder ball (1 of 2)

top electrode solder ball (2 of 2)

bottom electrode solder ball

NC

Laser
A
A'
Lid
Substrate

Anchor
Resonator
A
Laser spot
Scan (optional)
A'
Anchor
Temperature fast cooling
slow cooling
Cooling
Electrically active dopant concentration
Temperature Total doping concentration
Starting point before heating
Inactive dopant concentration after wafer fabrication
Heating
Electrically active dopant concentration

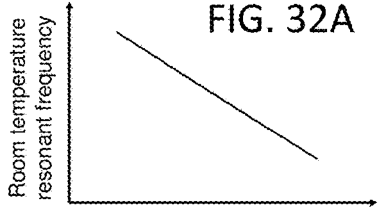
FIG. 32A
Room temperature
resonant frequency

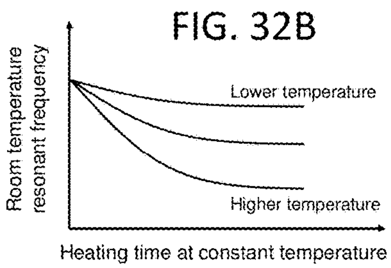
FIG. 32B
Room temperature
resonant frequency
Lower temperature
Higher temperature
Heating time at constant temperature

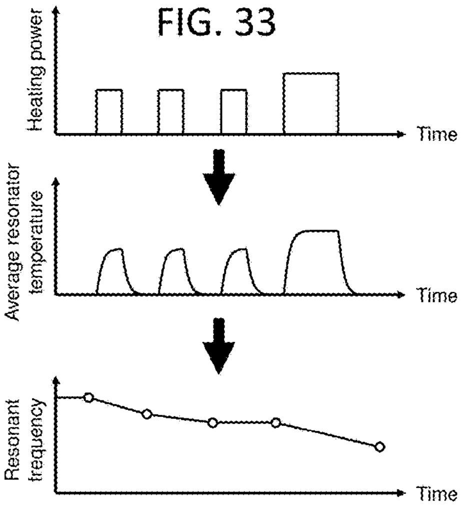
FIG. 33
Heating power
Time
Average resonator
temperature
Time
Resonant
frequency
Time

FIG. 34

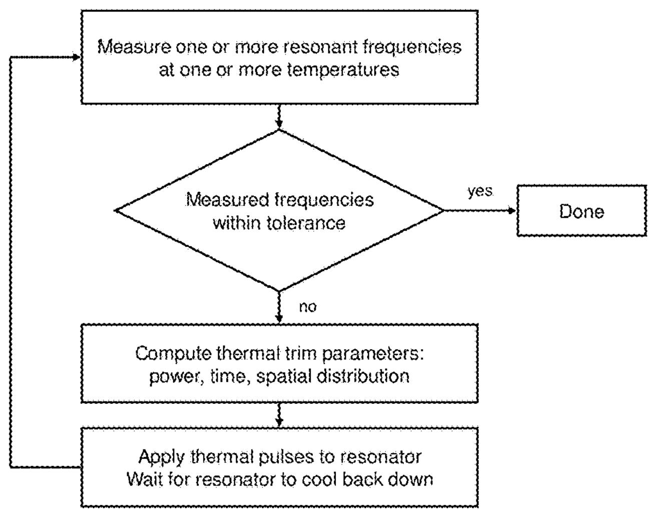
Measure one or more resonant frequencies
at one or more temperatures
Measured frequencies
within tolerance
yes
Done
no
Compute thermal trim parameters:
power, time, spatial distribution
Apply thermal pulses to resonator
Wait for resonator to cool back down Thermal power
Trim iteration
Frequency
Upper limit
Target
Lower limit
Trim iteration Thermal power
Trim iteration
Frequency
Upper limit
Target
Lower limit
Trim iteration Mode 2
Mode 2
Anchor
Tethers
Mode 1
Mode 1

Electrodes

RF input
RF input
RF input
RF input
Heated regions
(tune mode 1)
Heat flow

Heated regions
(tune mode 2)

Terminals
Heated regions
(tune mode 1)
= current source
= ground
= open
Heated regions
(tune mode 2)
= current source
= ground
= open

MICROELECTROMECHANICAL RESONATOR

CROSS-REFERENCE TO RELATED APPLICATIONS

This application is a continuation of U.S. application Ser. No. 18/412,732, filed Jan. 15, 2024, which is a continuation of U.S. application Ser. No. 17/847,438, filed Jun. 23, 2022 (now U.S. Pat. No. 11,916,534), which is a divisional of U.S. application Ser. No. 17/544,120, filed Dec. 7, 2021 (now U.S. Pat. No. 11,677,379), which is a divisional of U.S. application Ser. No. 16/245,184 filed Jan. 10, 2019 (now U.S. Pat. No. 11,228,298), which is a divisional of U.S. application Ser. No. 15/497,146 filed Apr. 25, 2017 (now U.S. Pat. No. 10,218,333), which is a divisional of U.S. application Ser. No. 15/186,510 filed Jun. 19, 2016 (now U.S. Pat. No. 9,712,128), which (i) claims the benefit of U.S. Provisional Application No. 62/181,767 filed Jun. 19, 2015 and U.S. Provisional Application No. 62/183,689 filed Jun. 23, 2015, and (ii) is a continuation-in-part of U.S. patent application Ser. No. 14/617,753 filed Feb. 9, 2015 (now U.S. Pat. No. 9,705,470), which claims the benefit of U.S. Provisional Application No. 61/937,601 filed Feb. 9, 2014. Each of the above-identified patent applications is hereby incorporated by reference.

TECHNICAL FIELD

The disclosure herein relates to the field of microelectromechanical systems (MEMS) and more particularly to resonant MEMS structures.

BRIEF DESCRIPTION OF THE DRAWING

The various embodiments disclosed herein are illustrated by way of example, and not by way of limitation, in the figures of the accompanying drawings and in which:

FIGS. 1A-1C illustrate various physical, electrical and TCF-engineering aspects of an exemplary piezoelectrically-actuated MEMS resonator having at least two degenerately doped silicon layers;

FIG. 2A illustrates examples of positive/negative first-order and second-order temperature coefficients of frequency (TCFs), and also shows positive and negative $0^{th}$ order TCFs (i.e., temperature-independent frequency offsets);

FIGS. 2B-2E illustrate embodiments of a resonant structure consisting of one or more materials that allow for control of first- and higher-order resonator temperature coefficients of frequency;

FIG. 2F illustrates an embodiment of a resonator having a degenerately doped semiconductor layer in which dopant concentration and/or type is non-uniform across the resonator body;

FIG. 2G illustrates an embodiment of a resonator having regions in or on the resonator of a locally deposited or patterned material with desired properties;

FIG. 2H illustrates examples of engineered TCFs within resonator embodiments of FIGS. 2B-2G and other embodiments disclosed herein;

FIG. 2I illustrates the resonator embodiment of FIG. 2E in which the conductive layer is made sufficiently thin to render its contribution to the TCFs of the composite structure negligible;

FIG. 2J illustrates an embodiment of a MEMS resonator having degenerately doped single-crystal silicon layered with aluminum nitride and with those two layers sandwiched between top and bottom electrodes;

FIG. 3 illustrates an embodiment of a MEMS system in which a resonator is co-fabricated on a single substrate with a temperature sensitive element and a heater (the temperature sensitive element and/or the heater can be optionally excluded in alternative embodiments);

FIGS. 4A-41 illustrate embodiments of MEMS systems in which a temperature-stable MEMS resonator is combined with additional active temperature compensation for improved frequency stability over temperature;

FIG. 5A illustrates an embodiment of a degenerately-doped-silicon MEMS resonator integrated with one or more components of an active temperature compensation system;

FIG. 5B illustrates an example of a temperature compensation operation within the embodiment of FIG. 5A;

FIG. 6 illustrates various options for integrating a temperature-sensor within an oscillator system having a dual-silicon resonator;

FIG. 7 illustrates an exemplary process for fabricating a MEMS thermistor and dual-silicon MEMS resonator within neighboring regions of the same SOI substrate;

FIG. 8 illustrates an exemplary interconnect arrangement within a dual-silicon resonator having an additional lightly-doped (or undoped) single-crystal silicon thermistor layer as part of the resonator structure;

FIGS. 11A and 11B illustrate dual-silicon resonator embodiments having one or more metal layers or silicides to improve electrode conductivity and/or serve as seed beds to improve material structuring of an internal piezoelectric layer;

FIGS. 12A and 12B illustrate alternative material stacks having the three layers shown in FIG. 1A together with an additional metal layer;

FIGS. 13A and 13B illustrate embodiments of symmetric dual-silicon material stacks that avoid surface-tension imbalance and resultant structural warping;

FIG. 14 illustrates an exemplary micromachined member (or structure) within a microelectromechanical system (MEMS) that may be heated or superheated using various techniques and circuit configurations disclosed herein;

FIG. 15A illustrates a profile view of an exemplary MEMS device having a DDS resonator together with structural interconnections that permit production time joule heating;

FIG. 15B illustrates a post-encapsulation joule-heating MEMS embodiment in which electrically conductive vias extend through a hermetically encapsulating lid arrangement to make electrical contact with electrically conductive anchoring structures;

FIG. 15C illustrates an alternative embodiment in which electrically conductive vias extend through the device substrate (e.g., bulk semiconductor) to enable joule-heating current flow through the DDS resonator;

FIGS. 16A-16C illustrate embodiments of multi-functional tether structures, showing examples of a bulk tether, a composite tether, and an extended-path tether, respectively;

FIG. 16D illustrates an exemplary thermal profile achieved by conducting a DC or AC joule heating current through a moveable micromachined member via anchors and folded tethers;

FIG. 17 illustrates another joule-heating MEMS embodiment in which respective pairs of "flexible" tethers are provided to conduct joule-heating current to the moveable micromachined member, with each such tether pair thus forming a dedicated heating port;

FIGS. 18A and 18B illustrate exemplary capacitively-coupled heating arrangements in which electrodes that serve as drive and/or sense electrodes double as radio-frequency (RF) energy inputs that drive AC joule-heating currents within a moveable micromachined member;

FIG. 19A illustrates a joule-heating embodiment in which energy is supplied conductively or capacitively to respective layers of a multi-layer MEMS resonator;

FIG. 19B illustrates an alternative heating arrangement in which joule-heating is sourced primarily within a patterned electrode layer of the dual-silicon resonator;

FIG. 20 illustrates another embodiment in which an RF energy source is coupled across the outer layers of the moveable micromachined member shown in FIG. 19A;

FIG. 21 illustrates an encapsulated or chip-scale MEMS package having a MEMS die (e.g., with a moveable micromachined member formed thereon) and a control die;

FIG. 22 illustrates an embodiment of a programmable heating controller that may be used to implement the programmable heating control circuitry of FIG. 22;

FIG. 23 illustrates an arrangement in which multiple heating-power drivers within an external heating controller may be coupled to respective singulated or on-wafer MEMS devices;

FIG. 24A illustrates an exemplary heating power profile that may be produced within the external or in-situ heating controllers of FIGS. 22 and 23, or any other practicable heating source, together with exemplary temperatures produced within a moveable micromachined member;

FIG. 24B illustrates exemplary power-pulse wave-shaping that may be applied to achieve controlled MEMS structure cool down and/or heating;

FIG. 25 illustrates an exemplary processing of packaged MEMS device in which an oven reflow operation is carried out to merge two separate terminals that form a heating port into a single operational control terminal;

FIG. 26 illustrates an exemplary heating port arrangement within a packaged MEMS device having two front-side terminals and, to enable joule heating/superheating, one back-side terminal; and FIGS. 27A and 27B illustrate exemplary circuit models corresponding to the packaged MEMS device of FIG. 26 during heating/superheating and run-time operation, respectively.

FIGS. 28A and 28B illustrate exemplary electrical interconnections between encapsulation-level through-silicon vias (TSVs) and piezo-actuated resonator electrodes that enable both package-level terminal interconnection (i.e., during subsequent packaging steps) and post-encapsulation joule-heating of the MEMS resonator;

FIGS. 29A and 29B illustrate an alternative terminal reduction approach in which three or more encapsulation-level terminals are merged prior to enclosure within a package housing to expose only two electrically independent package-level terminals;

FIG. 30 illustrates heating of MEMS resonator via a laser beam that is preferentially absorbed by the DDS with respect to the lid and substrate that are part of the hermetic encapsulation;

FIG. 31A illustrates the variation in electrically active dopant concentration in a DDS as a function of temperature during a heating cycle; and FIG. 31B illustrates the cooling rate dependence of electrically active dopant concentration;

FIG. 32A illustrates the reduction in room temperature resonant frequency that accompanies an increase in the electrically active dopant concentration; and FIG. 32B illustrates the dependence of room temperature resonant frequency of a DDS-containing MEMS resonator on both the time and temperature of a heating cycle after which the resonator is rapidly cooled; and FIG. 33 illustrates a sequence of heating pulses applied to a MEMS resonator and the corresponding average temperature of the MEMS structure during each cycle, and resulting resonant frequency of one of the MEMS resonator eigenmodes at or near room temperature after each heating pulse;

FIG. 34 describes an algorithm to trim the frequency of one or more resonant modes of a MEMS structure at one or more temperatures in an automated, closed loop fashion;

FIG. 35 illustrates an exemplary frequency trimming result in which the thermal power and/or time are increase over a series of heating pulse iterations until the room temperature frequency is within an acceptable tolerance about a target frequency;

FIG. 36 illustrates an exemplary frequency trimming result in which the heating power is reduced after three iterations to take advantage of the reversible nature of temperature-activated frequency tuning to increase the resonant frequency after initially overshooting the frequency trim target;

FIG. 38 illustrates adjustment of the frequency relationship between two modes of a similar MEMS structure based upon the activation of a subset of heating terminals, except that the Joule heating is accomplished through terminals that are directly coupled to the structure, allowing the possibility of DC heating currents;

DETAILED DESCRIPTION

Figures 9A, 9B:
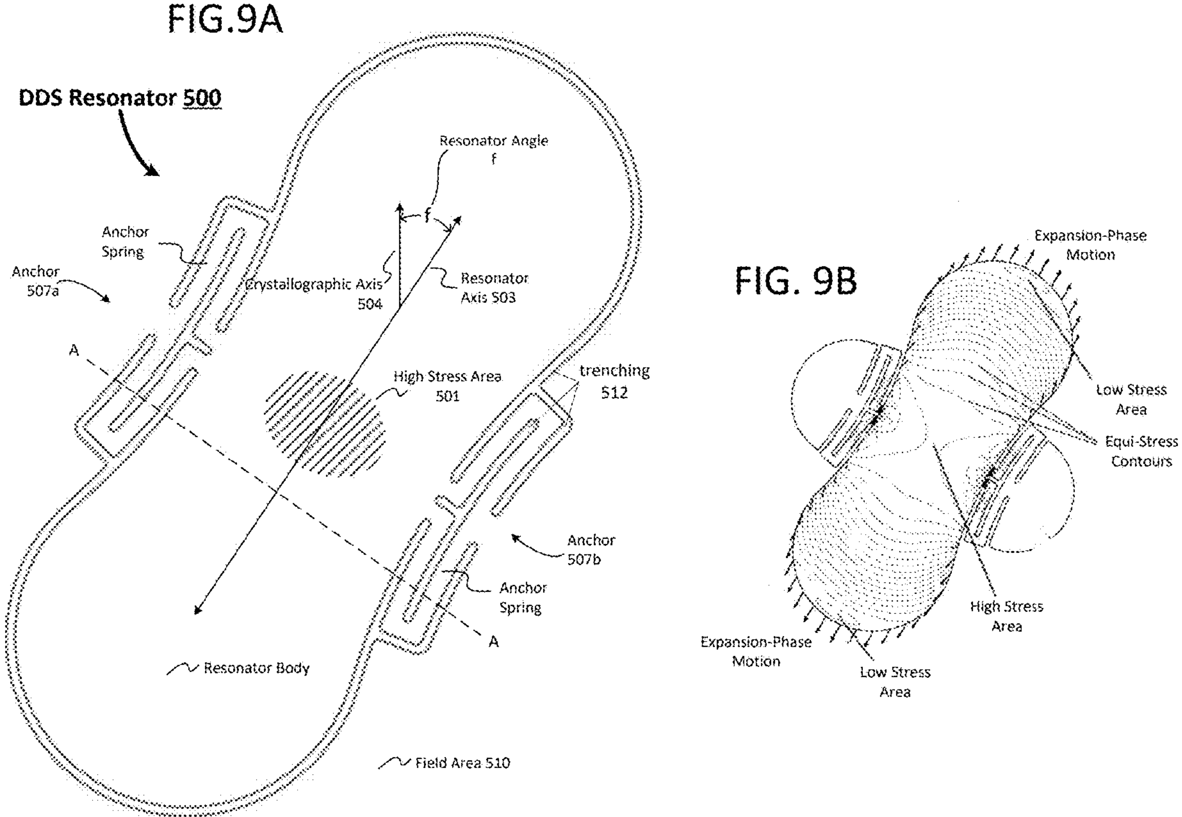
FIG. 9A illustrates an embodiment of a degenerately-doped semiconductor (DDS) resonator having one or more features described in connection with FIGS. 1A-5B.
FIG. 9B illustrates an exemplary finite-element model of the DDS resonator of FIG. 9A.

Temperature-stable, wear-resistant resonators formed by material stacks having one or more degenerately-doped silicon layers and a piezoelectric material layer are disclosed in various embodiments herein. In a number of implementations, the piezoelectric material layer ("piezo layer") is sandwiched between a degenerately-doped single-crystal silicon "core" layer and a degenerately-doped polycrystalline layer, with those outer silicon layers serving as electrodes for conducting drive/sense signals to/from the piezo layer-obviating conventional metal electrode layers and their undesired aging properties (e.g., wear-hardening over time). Further, as described in greater detail below, layer thickness ratios, crystallographic orientation of the single-crystal layer (at least), mode shaping and/or degenerate dopant concentration/type may be engineered to substantially zero or null at least the first-order (linear) and second-order (parabolic) temperature coefficients of frequency (TCFs) for the material stack as a whole, with the intrinsic parabolic TCF of the piezo layer, for example, being substantially canceled by a reverse-polarity parabolic TCF engineered within the degenerately doped single-crystal silicon layer. Thus, in addition to the serving double duty as both a sense/drive electrode and the resonator bulk layer, the degenerately doped single-crystal silicon layer provides engineering "knobs" for yielding resonant MEMS structures having temperature-stable resonant frequencies (e.g., zero or near-zero combined TCF) over a desired operating temperature range (e.g., −40° C. to +85° C.). Similarly, the degenerately doped polysilicon layer serves as a wear-resistant electrode (and thus may be viewed, along with the piezo layer as part of the sense/drive component) and may also enable multiple degrees of TCF engineering. In yet other embodiments, one or more in situ temperature-sense elements (e.g., implemented within the resonator package, encapsulation chamber or even within the resonator structure itself), are provided to enable temperature-adjusted frequency-pull and/or post-resonator output frequency adjustment to further flatten the net resonator TCF (i.e., sum of $1^{st}$-order, $2^{nd}$-order, . . . , $n^{th}$-order TCFs) and/or compensate for aging affects or even permit run-time frequency adjustment (e.g., by enabling closed-loop heating to a desired operating temperature that leverages a $0^{th}$-order TCF). These and other features and embodiments are described in greater detail below.

Figures 1A, 1B, 1C:
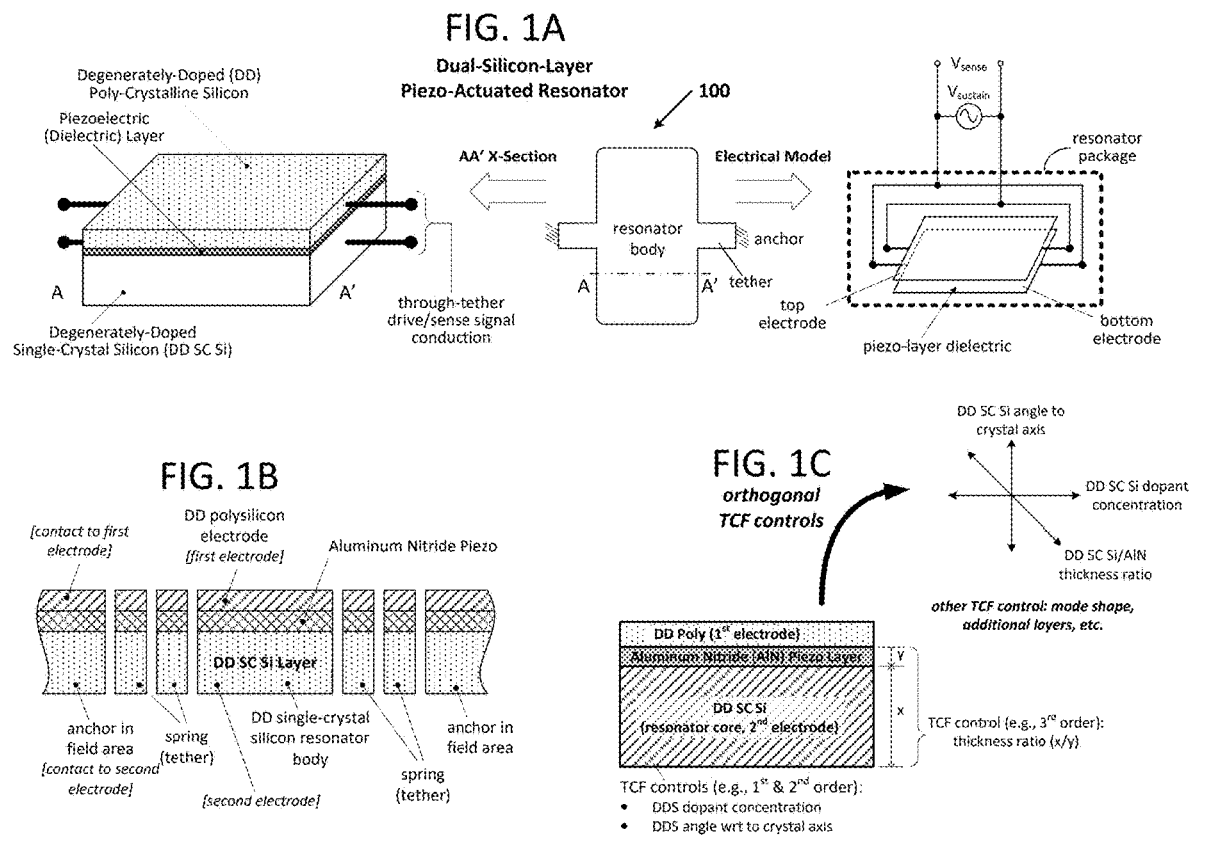

FIGS. 1A-1C illustrate various physical, electrical and TCF-engineering aspects of an exemplary piezoelectrically-actuated MEMS resonator 100 having at least two degenerately-doped silicon layers, referred to herein as a "dual-silicon" resonator. Referring first to FIG. 1A, the physical stack of materials shown in cross-section A-A' includes a degenerately-doped (DD) single-crystal silicon (SC Si) core, a piezoelectric layer (a dielectric), and a degenerately-doped polycrystalline silicon (DD poly) layer. Dopant concentrations within the outer silicon layers is sufficiently high (e.g., greater than 1E18 atoms/$cm^3$, 1E19 atoms/$cm^3$, 1E20 atoms/$cm^3$, 2E20 atoms/$cm^3$ or possibly higher) to effect low-loss electrical conductivity and thus enable the silicon layers to serve as electrodes for establishing a time-varying piezoelectric actuation voltage across the piezoelectric layer, obviating more conventional metal layers that tend to harden over time and undesirably shift the resonator frequency. In the particular embodiment shown, the top and bottom electrodes implemented by the poly and single-crystal silicon layers, respectively (with "top" and "bottom" referring arbitrarily to the drawing orientation as the structure may be flipped or otherwise reoriented in deployment, use, etc.), are electrically coupled to exterior package contacts through mechanical tether and anchoring structures to enable resonator reception of a piezo-actuating "drive" signal ($V_{sustain}$) and enable external sensing of a piezoelectric output signal ($V_{sense}$) indicative of mechanical motion of the resonant structure. As shown, the resonator material stack may be electrically modeled by a plate capacitance (the piezo electric layer) coupled to drive and sense nodes via low-loss conductive paths.

FIG. 1B illustrates an exemplary cross section through anchors, tethers and body of a more detailed dual-silicon resonator. As shown, the piezoelectric layer is implemented by an aluminum nitride film (AlN) which extends, along with the two degenerately doped silicon layers, through the tethers and anchors. Although depicted as disjointed elements, the tethers, anchors and resonator body are physically coupled to one another, with the tethers serving as spring-like structures to permit mechanical motion of the resonator (the "moveable micromachined member") which is otherwise released from and suspended relative to the surrounding field areas and underlying substrate or insulator layer (anchor and tethering structure(s) may alternatively or additionally be disposed beneath the resonator body). Accordingly, conductive paths may be formed through the anchors and tethers to generate an electrostatic potential across the aluminum nitride piezo layer and thereby actuate the resonator, causing oscillatory mechanical motion thereof in one or more mechanical resonance modes (e.g., extensional, breathe, lamé, flexural, bulk-acoustic, or any other practicable MEMS resonating mode-in-plane or out-of-plane). Various alternative materials may be used to implement the piezoelectric layer in the embodiment of FIG. 1B and all others disclosed herein including, for example and without limitation, Zinc Oxide (ZnO), Lead Zirconate Titanate ($Pb[Zr_xTi_{1-x}]O_3$ $0 \leq x \leq 1$), Lithium Niobate ($LiNbO_3$), Gallium Nitride (GaN), Indium Nitride (InN), Scandium Aluminum Nitride (ScAlN), Quartz ($SiO_4$), etc.

With respect to TCF engineering, the degenerately-doped single crystal silicon incorporates at least two degrees of authority/control into a single layer: crystal orientation and dopant concentration. Additional authority is available with respect to deposition of the piezoelectric film on the highly doped single crystal silicon. In particular, the thickness ratio of the degenerately-doped single crystal silicon layer and an aluminum nitride piezoelectric layer ('x/y') may be selected to yield substantially matched, but opposite-sign second-order TCFs in those two layers, thereby canceling or substantially attenuating their combined parabolic contribution to the net resonator TCF, and also providing some control (authority) over the third-order resonator TCF. The preferred crystal orientation in the polysilicon film may also affect the first- and second-order TCFs. Accordingly, as shown in FIG. 1C, at least the first-order and second-order TCFs of the dual-silicon piezo-actuated resonator of FIGS. 1A and 1B can be engineered (controlled, manipulated) by varying the crystal orientation of the degenerately-doped single crystal silicon layer at a particular doping concentration, dopant type and layer thickness, the aluminum nitride layer thickness, and/or the degenerately-doped polysilicon layer thickness at a particular dopant concentration. In a number of embodiments, for example, the various TCF orders are engineered to yield a substantially zero net TCF (e.g., frequency within 50 ppm, 20 ppm, 10 ppm or less of target) over a desired operating range (e.g., −40° C. to 85° C.). More generally, such multi-order-compensated resonators (i.e., nulling not only first-order TCF, but also quadratic and possibly cubic and higher-order TCF terms) may be engineered to:

- null or otherwise attenuate (e.g., to zero, substantially zero, or an otherwise negligible level) the first, second, third, and fourth order TCF terms or any two of those.
- exhibit a nonzero value of the linear TCF specifically chosen to partly or wholly compensate (or cancel or counteract) the cubic TCF and thereby reduce the absolute frequency variation over a particular temperature range.

exhibit one or more local extrema in the temperature-dependent frequency (i.e., having a temperature at which a local minimum or maximum frequency occurs), also called "turn-over temperatures."

exhibit a turn-over at the nominal operating temperature.

Also, in a departure from TCF compensation schemes that cumulatively apply material layers to compensate respective TCF terms (e.g., one or more material layers to compensate for first-order TCF, one or more other material layers to compensate for second-order TCF, etc.), embodiments of temperature-engineered resonant structures disclosed herein include a semiconductor layer or region engineered to compensate, by itself, for both the linear TCF and one or more higher-order TCFs and thus enable construction of "short stack" MEMS resonators consisting of a reduced number of material layers relative to layer-per-TCF implementations. For one example, the linear TCF of a resonator fabricated from an anisotropic degenerately doped semiconductor (DDS), such as single-crystal silicon, is adjusted by rotating the orientation of the resonator geometry relative to underlying crystal axes. As a second example utilizing an anisotropic degenerately doped semiconductor, the linear TCF of a resonator is tuned by altering the geometry of the resonator and/or the mode shape. As another example, in a number of embodiments, a semiconductor material is doped to a sufficiently high concentration that the polarity of the second-order TCF (i.e. the sign of the quadratic TCF) of a resonator constructed from that material is reversed relative to the second-order TCF of a resonator constructed from a more lightly doped version of that semiconductor (e.g., yielding a positive quadratic TCF, in contrast to the negative quadratic TCF exhibited at lower dopant concentrations). The reverse-polarity quadratic TCF may be exploited to partially or wholly cancel the quadratic TCF of one or more other materials (for example a piezoelectric material having a quadratic TCF polarity opposite that of a degenerately doped semiconductor material) within a composite resonator embodiment over a given temperature range, thus producing a resonator with a reduced quadratic TCF magnitude. As explained, a resonant structure with engineered linear and higher order TCFs can be fabricated exclusively from a degenerately doped semiconductor, or degenerately doped semiconductors may be deployed within composite resonant structures to enable engineered temperature stability. For example, composite structures suitable for piezoelectric micromechanical resonators are disclosed below and address the problems of frequency stability over temperature and the engineering of linear and higher-order TCFs. As discussed, such composite structures offer high quality factor, low hysteresis over temperature, low aging of frequency over time, compatibility with batch micro-fabrication methods, small form factor, insensitivity to shock and vibration, and other desirable features.

Resonant structures as described herein may be fabricated wholly or partly from a degenerately doped monocrystalline or polycrystalline semiconductor (e.g., silicon, germanium, diamond, carbon, silicon carbide, compound semiconductors such as silicon germanium, etc.) or using combinations of such semiconductors. Pure and lightly-doped semiconductors are insulating materials at low temperature. When the semiconductor is doped with certain impurity atoms, above some dopant concentration the semiconductor will exhibit metallic or highly conductive behavior even at low temperatures (e.g. for single crystal silicon, approaching 0 Kelvin). Such a semiconductor is said to be "degenerately doped". For example, in single-crystal silicon, this may occur at a phosphorus doping level at or above 4E18 atoms/$cm^3$. More generally, the onset of degeneracy varies with semiconductor and dopant. In addition to a change in electrical conductivity, various material properties of semiconductors change with doping level, as well as the temperature dependencies of various material properties. In particular, resonators fabricated with a degenerately doped semiconductor can exhibit significantly different TCFs than similar resonators constructed with a more lightly doped version of the semiconductor material. In some cases, it is even possible to reverse the sign (or polarity) of one or more TCFs by altering the doping level of a semiconductor used as a structural material in a resonator. These temperature-dependency changes are exploited in a number of resonator embodiments to enable sophisticated, targeted engineering of temperature coefficients.

In specific embodiments of resonant composite structures disclosed herein, two of the constituent materials are a degenerately-doped semiconductor (DDS) and a piezoelectric material. This composite structure, an example of a DDS resonator, can be engineered to simultaneously achieve target values or ranges of values for two or more of the TCFs of a particular resonance mode. In one embodiment, for instance, a composite structure is constructed from degenerately doped silicon (a semiconductor) and aluminum nitride (a piezoelectric material—others may be used as discussed above) and engineered such that the first-order and second-order TCFs of a particular resonance mode of the structure as a whole (i.e., the linear and quadratic TCFs, respectively) are both within a specified tolerance from zero, thus yielding a temperature-insensitive resonator or temperature-compensated resonator.

In addition to the two primary constituent materials, additional materials may be present in the composite structure. In particular, another conductive material such as metal or another semiconductor layer (which may also be degenerately doped) may also be included to serve as an additional electrode (as discussed below, the DDS layer may serve as another electrode within the composite structure). Examples of suitable electrode materials include but are not limited to heavily doped silicon, silicides, tungsten, molybdenum, titanium or aluminum. The term electrode is used herein to mean, without limitation, a conductive material used to establish an electric field for transduction of electrical to mechanical energy or mechanical to electrical energy. Note that layers applied as electrodes may also serve other functions, for example and without limitation, a piezoresistive function, a heating function, etc.

The embodiments disclosed herein address many or all of the aforementioned problems and issues for resonator performance through engineering multiple parameters or design degrees of freedom of a structure with reduced sensitivity to temperature while providing piezoelectric coupling for some structures, high quality factor, low hysteresis, low aging, batch micro-fabrication compatibility, small form factor, insensitivity to shock and vibration, etc.

For mechanical resonators, the natural frequency is determined principally by the mass density and the stiffness of the material from which the resonator is constructed. The change in material stiffness due to change in ambient temperature is of principal concern in the design and manufacture of resonators because it changes the natural frequency of the resonator. The change in material geometry due to thermal expansion or contraction is also a concern as it also changes the natural frequency of the resonator.

For pedagogical purposes, it can be illustrative of the principle of TCF engineering to examine a simple model. One such model is where the resonator structure is constructed of thin layers and only the motion of the material on a single axis is considered. For this simple example, the stiffness of a material is described by a single number, the effective elastic modulus. This is a simplification of the physical case where all dimensions of motion should be considered and the stiffness of a material might be described by a tensor. In the simple model, the elastic modulus of an anisotropic material depends on the material orientation.

For composite structures, a simple model for the $n^{th}$ temperature coefficient of frequency is a weighted average of the contributions of all constituent parts of the resonator. This average can be written as follows for a stack of thin films (or layers) of material:

$$\lambda_n = \frac{\sum_i \lambda_n^{(i)} E_i t_i}{\sum_i E_i t_i}$$

(2), where the sum over i is taken over all films in the stack, $t_i$ is the thickness of the $i^{th}$ film, $E_i$ is the elastic modulus of the $i^{th}$ film, and $\lambda^{(i)}_n$ is the $n^{th}$ material TCF for the $i^{th}$ film. The coefficient $\lambda^{(i)}_n$ is a material parameter of the $i^{th}$ film that lumps together the contributions from thermal expansion and temperature-sensitivity of the elastic modulus to give the temperature coefficient of frequency for a resonator constructed of that material alone. Equation (2) can be generalized for composite structures with arbitrary geometries, non-uniform, and anisotropic materials. Note that, in that case, the $\lambda^{(i)}_n$ coefficients can be tensors. The $n^{th}$ TCF for a resonator constructed out of at least one material is $\lambda_n$.

Equation (2) shows that the first requirement for engineering the temperature coefficients of a resonator's frequency using composite materials is to use materials that bracket the desired values. For example, if $\lambda_n$ is desired to be zero, this result can be obtained if at least one $\lambda^{(i)}_n$ is positive and at least one other $\lambda^{(i)}_n$ is negative.

Equation (2) also indicates that in order to simultaneously engineer N temperature coefficients such that $\lambda_n=\lambda^*_n$, where $\lambda^*_n$ is the desired value of the $n^{th}$ coefficient, equation (2) can be split into N separate equations. Typically the solution of N equations is obtained with the variation of at least N variables. These N variables can be called design variables and they should have sufficient design authority such that the solution to these N equations is in an accessible space. Design authority is a description for the magnitude of the effect that a change in a given design parameter has on a metric of interest. The accessible design space depends on fabrication constraints (e.g. material selection, film thickness ranges and control accuracy) and operation constraints (e.g. quality factor, frequency, motional resistance).

Despite the traditional emphasis on linear TCF control, analysis shows that composite resonator performance may be substantially increased through control over at least the first two temperature coefficients. As mentioned above, a resonator implementation that exhibits control over at least the first two temperature coefficients of frequency can be constructed from aluminum nitride and degenerately-doped single-crystal silicon. Such a resonator can be compatible with piezoelectric transduction and may exhibit other advantageous properties including but not limited to high quality factor (Q), low hysteresis over temperature, low frequency aging over time, batch micro-fabrication compatibility, small form factor, and insensitivity to shock and vibration.

In addition to controlling at least the first-order and second-order TCFs, the following non-exhaustive list of criteria are applied in designing selected resonator embodiments disclosed herein:

- The temperature coefficients of the individual materials combine to yield the target temperature coefficient of frequency for the overall structure. For example, if the target first-order TCF is at or near zero, and the first-order TCFs of at least one component-material is substantially positive, then the first-order TCF of at least one other component-material is engineered and/or selected to be negative.
- There are N design parameters to enable control over N temperature coefficients.
- The combination of design parameters have sufficient design authority to enable a solution within the design space defined by fabrication constraints and design constraints.

Aluminum nitride resonators typically have negative linear and quadratic TCFs. The temperature coefficients of thin film polycrystalline aluminum nitride depend weakly on the film structure. Similarly, resonators constructed from non-degenerate single-crystal silicon have negative linear and quadratic TCFs, and the TCFs tend to be only weakly dependent on crystal orientation.

The linear TCF of a resonator constructed from degenerately-doped single-crystal silicon can be positive or negative depending on crystal orientation, doping level and mode shape. Thus, crystal orientation constitutes a design parameter (or design degree of freedom) that may be adjusted to control the linear TCF term. The quadratic TCF of a resonator constructed from degenerately doped single-crystal silicon can be positive or negative depending on dopant concentration, crystal orientation, doping level and mode shape. FIG. 2A illustrates examples of such positive/negative first-order and second-order TCFs, and also shows positive and negative $0^{th}$ order TCFs (i.e., temperature-independent frequency offsets).

It becomes possible to independently tune (i.e., control and potentially null) both the first-order and second-order (linear and quadratic) TCF characteristics of a degenerately doped single crystal silicon layer through manipulation of orthogonal design parameters, for example, crystal orientation and dopant concentration. Polycrystalline silicon resonators also can be degenerately doped to achieve a range of linear and quadratic TCF values, although if the material lacks a dominant crystallographic orientation then one design degree of freedom may be lost.

FIGS. 2B-2E illustrate exemplary embodiments of a DDS resonator with a plan view of the resonator shown at 1*a* together with optional electrode dispositions within and adjacent the resonant structure.

Referring first to FIG. 2B, a resonant structure including at least one degenerately doped semiconductor layer ("DDS Resonator") is disposed between two electrode structures (e.g., used for driving and sensing the resonator) and having one or more anchor points. In the embodiment shown, spring-like members or "tethers" extend from opposite sides of the resonator body to anchors in the surrounding material field to establish dual anchor points, though more or fewer anchor points may be implemented in alternative embodiments. Also, while an oblong or rectangular resonator shape is depicted, DDS resonators may be fabricated in any practicable shape and/or aspect ratio.

The electrodes on either side of the DDS resonator are shown in dashed outline to emphasize their optional nature (a convention applied in other drawings herein, though the absence of dashed-line presentation should not be construed as meaning that a given element or structure is required). Also, one or more electrically-isolated electrode regions may be implemented within a given resonator layer as shown by the T-shaped regions outlined within the resonator body. One or more alternately-shaped electrode regions (i.e., having different shapes than those shown) may be employed in alternative embodiments, and the resonator body itself may also be employed as an electrode.

In the case of a single-layer degenerately doped silicon resonator, the motion of the resonator can be sensed electrostatically or piezoresistively with appropriate electrical connections. FIGS. 2C-2E illustrate cross-sections of exemplary material stacks (i.e., across the resonant structure at line A-A' in FIG. 2B) including a monolithic (single-layer) stack at 2C, two-layer material stack at 2D and three-layer material stack at 2E. As explained below, additional material stacks and/or stacks of different material than shown in FIGS. 2C-2E may be present in alternative embodiments. As discussed above, because a single layer of uniformly degenerately doped silicon possesses at least two design parameters (crystallographic orientation and dopant concentration), a single-layer resonator (FIG. 2C) composed of uniformly degenerately doped single-crystal silicon can be engineered to have first-order and second-order TCFs that are equal or near to zero through the combination of fabrication process and design. Moreover, the dopant concentration need not be uniform. This allows for an arbitrarily large number of design parameters (i.e., "knobs" or degrees of freedom for manipulating resonator performance through design). It may also be advantageous to create one or more regions in or on the resonator that have different dopant concentration and/or different dopants as shown, for example, by the different degrees of shading in FIG. 2F. As shown in FIG. 2G, regions in or on the resonator could also be created with a locally deposited or patterned layer of material with desired properties. Locating these regions in areas of high stress in the vibrational mode shape of the resonator, for example, may be advantageous, enabling control over first, second, third, or higher order TCF values.

The resonator can also be engineered to have non-zero but controllable first- and second-order TCFs in order to accomplish specific design intent. For example, the first-order TCF can be designed such that it minimizes the total frequency variation over temperature by compensating for third-order and other odd-numbered higher order TCFs. As another example, the first-order TCF can be designed in order to adjust the temperature at which the frequency change with respect to temperature reaches an inflection point, a local minimum or a local maximum. The temperature at which the resonator reaches a local minimum or maximum frequency is commonly referred to as a turnover temperature. The resonator TCF may also be designed to cancel the TCF associated with its sustaining circuit (i.e. a circuit that sustains the mechanical motion of the resonator) or oscillator system. As a final example, the first- and second-order coefficients can be selected such that they are relatively insensitive to angle and dopant concentration for improved manufacturability. FIG. 2H illustrates examples of such engineered TCFs.

Referring again to FIG. 2D, a two-layer resonator composed of degenerately doped silicon and an additional film can be constructed. If the silicon layer is single crystal then this structure possesses at least three design parameters: crystallographic orientation and dopant concentration as described above, and additionally the ratio of the silicon thickness to the thickness of the added film. Thus, a two-layer resonator composed of degenerately doped silicon and an additional film may be capable of controlling three TCFs. In a number of embodiments, including that shown in FIG. 1C, the additional film is a piezoelectric material (e.g., aluminum nitride), though the additional film (or other material layer) may alternatively be any semiconductor, insulator or metal material selected for its TCF coefficients or another desirable mechanical or electrical property.

Additionally, a three-layer resonator can be formed as shown in FIG. 2E (i.e., with or without electrically isolated electrode regions as discussed). In one embodiment, such a three-layer resonator includes a degenerately doped single-crystal silicon layer that is coated in aluminum nitride (to form a piezoelectric layer) and an additional conductive layer (e.g., a metal layer or another degenerately doped polysilicon electrode layer). As discussed above in reference to FIG. 2C, the first- and second-order TCFs can be controlled by varying the crystal orientation of the bottom (single-crystal) silicon at a particular doping level and thickness, the aluminum nitride thickness, and the polysilicon thickness at a particular dopant concentration. The preferred crystal orientation in the polysilicon film may also affect the first- and second-order TCFs. An alternative set of design parameters can be chosen in order to engineer the TCF of the film stack, and the previous example is just one of many possibilities. Additionally, as shown at FIG. 2I, one of the layers in a three-layer resonator can be made sufficiently thin that its contribution to the TCFs of the composite structure is minimal (e.g., negligible or otherwise attenuated) and the compensation problem reduces to that of the two-layer resonator case. For example, the top layer may be implemented by a thin conductive metal or semiconductor layer instead of a degenerately doped polysilicon electrode layer.

Additional layers can be added to the stack. One example, shown in FIG. 2J, includes a degenerately-doped single-crystal silicon with aluminum nitride sandwiched between a top electrode and bottom electrode. The electrodes can be manufactured from any conductive metal or semiconductor film, for example polysilicon, aluminum, molybdenum, titanium, tungsten, or a silicide formed using a metal and silicon.

In various embodiments, a single MEMS system 200 may include multiple elements co-fabricated on the same substrate as a DDS resonator. Referring to FIG. 3, for example, a MEMS system 200 may include a DDS resonant element 201 (i.e., one form of MEMS resonator), one or more temperature sensing elements 203 ("temperature sensor"), and one or more heating elements 205 ("heater"). The temperature sensitive element may be used as part of an active temperature compensation system. One example of a temperature sensing element is a thermistor, which has a temperature-dependent electrical resistance. A heater may be included for initial calibration of the resonator frequency stability or to maintain the MEMS system at an approximately constant temperature despite variation in the ambient temperature. The temperature sensor and/or heater may be optionally excluded from MEMS system 200. As mentioned above (and described in greater detail below), the resonator structure may be used as a sensor instead of a frequency reference. Examples of alternative resonator applications include filters, gyroscopes, accelerometers, pressure sensors, microphones, magnetometers and mass sensors.

DDS resonators as described herein may be deployed with or without supplemental temperature compensation, thus effecting a purely passive temperature compensation scheme, or a combination of, for example, passive and active temperature compensation. Although active electrical compensation circuits, by definition, increase system power consumption, a combination of passive and active compensation (e.g., DDS resonator in combination with active compensation circuitry) may enable stability targets to be achieved with less power than active compensation alone, or enable greater stability than could be achieved with either approach alone. Passive mechanical temperature compensation is possible through material selection and structure design in both monolithic and composite resonator structures.

DDS resonators as disclosed herein may be combined with additional elements to form a system with improved temperature stability and/or other useful functionality. In FIG. 4A, for example, a DDS resonator 301 is combined with a sustaining circuit 303 to form an oscillator. The resonant frequency of the oscillator may be modified in a temperature-dependent manner (i.e., as shown in FIG. 4A, a temperature signal from sensor 305 is received within frequency modifying element 307 which, in turn, provides a temperature-dependent resonant-frequency control signal to DDS resonator 301 and/or sustaining circuit 303) and to yield a resonant frequency with improved temperature stability compared to that achievable with the DDS resonator alone. For example, a temperature-dependent electrostatic field may be applied directly to the DDS resonator using control electrodes that are co-fabricated with the resonator. An example of this approach is shown in FIG. 4B, with electrodes formed by the degenerately-doped silicon (DDSi) layer (electrode 2) and conductive layer (electrode 1) of the three-layer resonator embodiment described above (i.e., having DDSi, AlN and conductive layers, though other resonator structures/materials may be used in alternative embodiments), and the temperature-dependent electrostatic field formed by the time-varying and temperature-dependent difference between the potentials at the two electrodes, Ve1-Ve2.

As another example, if one component of the resonator has a significant piezoelectric response, the mechanical stress on the resonator can be modified in a temperature-dependent manner to adjust the resonator frequency. FIG. 4C illustrates an example of such an arrangement, again in the context of the tri-layer DDSi/AlN/conductive-material resonator discussed above, though other resonator structures and/or materials may be used.

In another embodiment, shown for example in FIG. 4D, a capacitive element may be included in a resonator sustaining circuit 321 and its capacitance can be modified in a temperature-dependent manner, thereby effecting a variable capacitance element 323 that may be used, for example, to tune the frequency of the oscillator system (i.e., system including DDS resonator 301 and sustaining circuit 321).

In an alternative embodiment, shown in FIG. 4E, the resonant frequency of DDS resonator 301 is modified after being output from an oscillator (formed at least in part by the DDS resonator 301 and sustaining circuit 303, as shown) by a frequency modifying element 331 within the resonator system. In a more specific implementation, shown for example in FIG. 4F, a temperature-dependent signal (e.g., from a temperature sensor as shown at 305 in FIG. 4E) can be provided to a fractional-N phase locked loop (an example of a frequency modifying element) in order to generate an output frequency that is substantially more stable over temperature than in the case of the resonator alone.

As shown in FIG. 4G, any of the oscillator systems shown in FIGS. 4A-4F (or other oscillator systems employing a DDS resonator) may include programmable/storage circuitry 350 in which TCF coefficients, control settings or other information may be stored. TCF coefficients recorded or stored in such an oscillator system may be based on the characteristics of an individual resonator (301) or group of resonators. Additionally, the coefficients may be based on characteristics of an individual sustaining circuit (303) or group of sustaining circuits. For example, the TCF behavior of oscillators or resonators may be determined by sweeping temperature and recording frequency as shown at 355, or by measuring room temperature characteristics (e.g., resistivity, frequency, etc.) that are predictive of temperature-dependent behavior.

Programmable/storage circuitry in which the TCF coefficients or other parameters indicative of temperature-dependent behavior may be stored may include any practicable on-chip or off-chip memory elements such as, for example and without limitation, registers or other volatile or non-volatile memory elements including, without limitation one-time-programmable (OTP) memory, electrically programmable read-only-memory (EPROM), Flash memory and so forth.

The TCF coefficients, or other parameters indicative of temperature dependent behavior, may also be stored as a resistance value. As shown in FIG. 4H, for example, the MEMS resonator die may contain at least one resistor that may be trimmed in resistance by a laser (or other method, such as thermal fusing) to record a value related to the behavior of the device over temperature. A thermistor and/or heater may also be used to store information in this manner. Additional bond pads or electrical interconnects are avoided by using a thermistor, or heater, for example, for this purpose.

The stored temperature behavior information may be used by an oscillator system to improve its frequency stability. The system can read out the stored information, combine it with a temperature measurement, and apply a correction to the resonator or oscillator system frequency. This operation is shown, for example, in the embodiment of FIG. 4I, in which a frequency-modifying element 375 receives a temperature signal from sensor 305 and reads out temperature-based correction data ("data") from programmable storage 350. Frequency correction signals corresponding to the correction data are then output to a resonator, sustaining circuit and/or output conditioning circuitry (e.g., PLL as discussed above in reference to FIG. 4F).

FIG. 5A illustrates an embodiment of MEMS arrangement having a DDS resonator 401 integrated with one or more components of an active temperature compensation system. The DDS resonator may be implemented in accordance with any of the resonator embodiments described herein and includes one or more layers (or other deposition or arrangement) of degenerately doped semiconductor material. In the embodiments shown, the temperature compensation circuitry includes one or more temperature sensing elements 403 (e.g., thermistor or other temperature sensor), one or more heating elements 405 and temperature control circuitry 407 to control operation of the heating elements (e.g., powering the heating elements as necessary to reach a predetermined or programmed temperature setpoint or temperature range). FIG. 5B illustrates an example of this temperature compensation operation, showing a time-varying heater output generated in accordance with a time-varying ambient temperature to maintain a constant or near-constant resonator temperature.

As FIG. 5A shows, integration of the DDS resonator and components of the temperature compensation system may vary from implementation to implementation. In one embodiment, shown for example in shaded region 411, DDS resonator 401 is integrated (i.e., co-fabricated with or otherwise formed on the same substrate or die) with a temperature sensor 403 ("Integrated T-Sense"), while temperature control circuitry 407 and heater 405 (i.e., one or more heating elements) are implemented off die. In another embodiment, indicated by region 415, temperature control circuitry 407 and heater 405 are integrated with temperature sensor 403 and DDS resonator 401, thus establishing a fully integrated active temperature compensation system within the MEMS resonator die. Though not specifically shown, DDS resonator 401 may alternatively be integrated with heater 405 while the temperature sensor(s) and/or temperature control circuitry remain off-die.

In a number of embodiments, a temperature sensor as shown in FIGS. 4A and 4E may be implemented within one or more component members of an encapsulated dual silicon resonator, or within a multi-die package that includes a dual-silicon resonator (MEMS) die and logic die. FIG. 6 illustrates various options for such temperature-sensor integration, including temperature sensor implementation within the lid or device layer of an encapsulated dual-silicon resonator and/or within a collocated logic die that additionally contains the sustaining/sensing circuit for driving the dual-silicon resonator into one or more resonant oscillation modes and sensing the resonant mechanical motion of the resonator. In the case of in situ disposition within the device layer of an encapsulated resonator structure, the temperature sensor may be implemented by a secondary micromachined structure—more specifically, by a micromachined (or MEMS) thermistor structure that is substantially released from the device-layer substrate and having any number of shapes that permit relatively stress/strain-free thermal expansion and contraction (and thus limited mechanically-induced nonlinearity in the temperature dependence of the end-to-end thermistor resistance). Though not specifically shown, the end-terminals of the MEMS thermistor may be coupled to TSVs in the encapsulation structure (lid and/or substrate) and ultimately to package level contacts to enable a temperature-sense output signal. When implemented in the lid wafer or logic die, the temperature sensor may be implemented by a silicon, polysilicon or metal thermistor feature, p-n junction and/or other thermally-sensitive feature. In yet other embodiments, discussed in greater detail below, the temperature sensor may be implemented by a patterned trace and/or p-n junction within one or more layers of the dual-silicon resonator itself.

FIG. 7 illustrates an exemplary process for fabricating a MEMS thermistor and dual-silicon MEMS resonator (having two degenerately doped silicon layers and a piezoelectric layer as discussed above) within neighboring regions of the same SOI substrate (i.e., to be resident within the same encapsulated device layer). As shown, an oxide layer is deposited over an SOI substrate and then etched (e.g., wet-etched) to yield a masked thermistor region. After PSG deposition (e.g., via vapor-phase $POCl_3$) and a mini drive cycle (relatively short duration drive) to achieve a relatively shallow dopant diffusion, and then a long anneal (relatively long and/or high-temperature drive) to achieve a deeper final dopant diffusion profile. At this point the single-crystal silicon device layer is degenerately doped (with process-dependent gradient) except in a thermistor region beneath the oxide mask, which remains relatively undoped. Remaining layers of the dual-silicon resonator are deposited (e.g., AlN and ISDP or any other materials according to variants discussed above), the oxide mask is removed and trenching/etching and release processes are carried out to finalize the two collocated MEMS elements-dual-silicon resonator and neighboring MEMS thermistor. By juxtaposing the MEMS thermistor and dual-silicon resonator within the same device layer, and within the same (eventually) encapsulated chamber and singulated die, temperature gradients between the thermistor and resonator that plague less proximal temperature-sense/resonator arrangements are eliminated (or rendered negligible), increasing accuracy of various temperature-compensation schemes encompassed by FIGS. 4A and 4E.

FIG. 8 illustrates an exemplary interconnect arrangement within a dual-silicon resonator having an additional lightly-doped (or undoped) single-crystal silicon thermistor layer as part of the resonator structure. While this arrangement adds a layer to the resonator material stack (in this case with the thermistor layer disposed beneath the dual degenerately doped silicon layers and piezo layer described above-any other stack location may be feasible), the thermal coupling of the thermistor layer to the remainder of the resonator material stack ensures zero or near-zero temperature differential between those two resonator regions, again, avoiding error-inducing temperature gradients suffered by less proximal arrangements. As shown, an additional pair of sense terminals may be coupled across the thermistor layer (e.g., through conductive structures in the tethering/anchoring structures to opposite lateral ends of the thermistor layer) and routed to external contacts of the encapsulated material stack and eventual resonator/thermistor package.

FIG. 9A illustrates an embodiment of a DDS resonator 500 having a number of the features described above. More specifically, DDS resonator 500 may be a single-layer structure (i.e., consisting only of a single degenerately doped semiconductor, such as degenerately doped silicon) or a multi-layer structure having, for example, aluminum nitride (AlN) or other piezoelectric layer disposed between a degenerately doped silicon layer and conductive layer as shown in FIGS. 1A-1C. Also, the dopant type or concentration within the DDS layer or any other layer of resonator 500 may be non-uniform (e.g., higher or lower concentration with high stress area 501 or other areas of the resonator body), and the resonator may be fabricated such that the resonator axis 503 is disposed at a nonzero angle, @ (i.e., the "resonator angle"), with respect to the crystallographic axis 504. As explained above, the resonator angle, DDS dopant concentration and type (including any non-uniformity) may each be specifically engineered to null first-order and at least one higher-order temperature coefficients of frequency. The mode shape, relative layer thicknesses, dopant types/concentrations of other layers (e.g., conductive layer formed from degenerately doped polysilicon) may also be specifically chosen, in combination with the dopant concentration/type of the bulk DDS layer, to yield a desired temperature-dependent resonant behavior, such as a temperature indicative behavior, temperature-stable (or temperature-insensitive) behavior, etc., over one or more desired operating temperature ranges. In the particular example shown, DDS resonator 500 has an ellipsoid shape with a pinched transverse dimension (i.e., orthogonal to resonator axis 503) between spring-bearing anchors 507*a* and 507*b*. Trenching 512 is etched or otherwise formed around and/or beneath the resonator and anchor spring elements to release the DDS resonator and anchor spring elements from (i.e., free those elements to move relative to) substrate field area 510.

DDS resonator 500 may have an A-A cross-section generally as shown in FIG. 1B—that is a degenerately-doped (DD) single-crystal silicon layer, an aluminum nitride piezoelectric layer and a degenerately-doped polysilicon electrode layer. Spring elements ("spring") and field area anchors are disposed on either side of the resonator body to form the respective anchors shown at 507*a* and 507*b* in FIG. 9A. Various other anchoring arrangements, with or without spring mounts, may be employed in alternative embodiments, including single-anchor arrangements or configurations of more than two anchors.

FIG. 9B illustrates an exemplary finite-element model of the DDS resonator of FIG. 9A, showing displacement and stress distribution during resonant vibration (or oscillation). For example, vectors (arrows) projecting from the edge of the resonator body illustrate a direction of motion of the resonator during an expansion phase of an oscillation cycle. In the example shown, a high stress area occurs between the anchors, while low stress areas occur at opposite ends of the resonator axis (i.e., the axis shown in FIG. 9A), and equi-stress contours occur between the low-stress and high-stress areas. The stress in the anchors is near zero.

FIGS. 10A-10I illustrate non-exhaustive examples of alternative resonator shapes/designs, with each exemplary resonator implemented in the crystallographic orientation (i.e., 45 degrees off-axis from the single-crystal silicon layer axis and/or predominant axis of the polysilicon layer, though various other angular orientations may be selected according to TCF engineering objectives). Referring first to the resonator shown in FIG. 10A, centrally-disposed bi-lateral tethers (springs) secure the otherwise freed resonator body to field-area anchors. The enlarged resonator end-masses tend to limit (restrict) modal interactions outside a desired resonant frequency over a frequency range of interest.

Figures 10A, 10B, 10C, 10D, 10E, 10F, 10G, 10H, 10I:
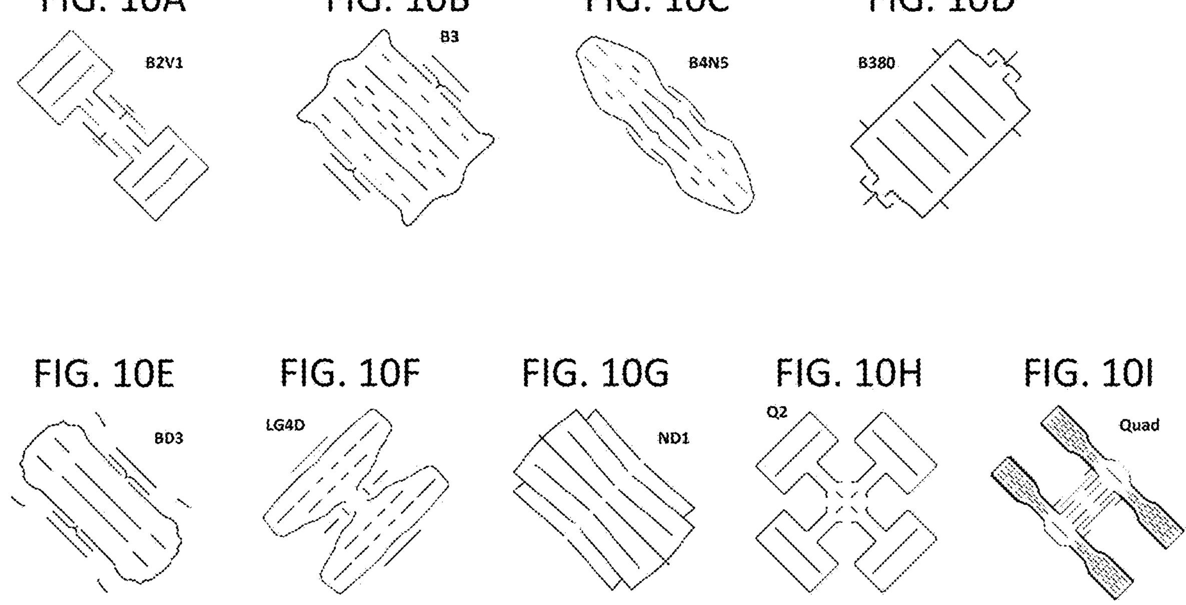
FIGS. 10A-10I illustrate non-exhaustive examples of dual-silicon resonator shapes and designs.

Referring to the resonators of FIGS. 10A-10I generally, resonant motion causes stress in selected directions across the resonator body in view of the in-plane anisotropic single crystal silicon core, particularly in the axial orientations shown. Slots or vents (e.g., ~7 microns wide) are provided within the resonant body to provide stress relief and facilitate vapor-phase HF release- and also to enable lateral dopant diffusion in at least in some processes (e.g., as discussed above in reference to FIGS. 2B and 31-3K) and/or effect TCF engineering. For example, in the resonators of FIGS. 10B and 10C (and others), the location and size of the slots are chosen to enhance dopant concentration in regions of high stress and, conversely, attenuate dopant concentration in low-stress regions. In the resonator designs of FIGS. 10D, 10E, 10F and 10G, vents in field areas (outside the resonator body) may be used to release those regions during vapor-phase HF etching, thus form cantilevers or other structures that suppress/avoid field-area interference with resonant behavior. The exemplary design in 10G includes a single centrally disposed anchor/tether from which release vents extend and tuned to limit transmission of vibration to the resonator bulk. The embodiments of FIGS. 10H and 10I illustrate centrally anchored resonators with more than two released members (or appendages) extending therefrom. The resonator of FIG. 10H, for example, resonates predominantly in extensional mode (with each of the point masses moving in-plane to and from the anchor), while the four beams extending outward from the central anchor in the FIG. 10I embodiment resonate in flexural mode (in effect, operating like a double-ended tuning fork). Various other resonator core shapes, anchoring schemes, appendage counts, angular orientations, etc. may be implemented in alternative embodiments, including embodiments that purposefully exhibit multiple simultaneous resonant modes (e.g., having different TCF characteristics as discussed below).

While omitted from a number of dual-silicon resonator embodiments described above, one or more metal layers or silicides may be introduced into such structures to improve electrode conductivity and/or serve as seed beds to improve material structuring of the piezoelectric layer (e.g., growing more ordered vertical grains of an aluminum nitride piezoelectric layer). FIG. 11A illustrates such an approach with a layer of titanium nitride, molybdenum, etc. formed over the degenerately-doped single-crystal silicon prior to piezoelectric layer formation, with the top electrode implemented, as before, by a layer of highly doped polysilicon. FIG. 11B illustrates a similar approach in which a metal deposition (e.g., titanium, tungsten, etc.) over the degenerately-doped single-crystal silicon layer is thermally driven to form a silicide seed bed (e.g., $TiSi_2$, WSi, etc.) for improved piezoelectric layer formation and improved bottom electrode conductivity. Though not specifically shown, the layer stack shown in FIG. 11A may be re-ordered by reversing the positions of the degenerately doped poly layer and metal layer. While such an arrangement may be susceptible to aging/work-hardening, top-electrode conductivity may be improved without sacrificing thermal frequency-trim authority afforded by the degenerately-doped polysilicon layer.

FIGS. 12A and 12B illustrate alternative resonator material stacks having the three layers shown in FIG. 1A (i.e., the two degenerately doped silicon layers and piezoelectric layer) together with an additional metal layer. More specifically, in FIG. 12A, an additional metal layer is disposed between the degenerately doped poly layer and the piezo layer and serves, at least in part, to enhance conductivity of the top electrode. In one embodiment, for example, the metal layer serves exclusively as the top electrode for the piezo layer (e.g., with field-area via contact directly to the buried metal layer), in which case the degenerately doped poly layer may serve primarily as authority for thermal frequency trim. In the embodiment of FIG. 12B, the degenerately-doped poly layer is relocated to the opposite side of the piezo layer (i.e., sandwiched between the piezo layer and core DD single-crystal silicon layer) thereby enhancing conductivity of the bottom electrode and maintaining the poly-layer thermal-trim authority. Though not specifically shown, an additional metal layer may also be disposed adjacent the bottom surface of the piezo layer (i.e., two metal layers sandwiching the piezo layer) to minimize conductive loss without sacrificing the TCF-engineering authority provided by the degenerately-doped single-crystal silicon core layer, or the thermal-trim authority provided by the degenerately-doped poly layer. Moreover, while the dual degenerately-doped silicon layers (single-crystal and polycrystalline silicon) are constituents of all material stacks described thus far, in all cases (including embodiments discussed below) either or both of those layers may be only lightly doped, undoped or even omitted altogether, for example, where their contribution to the resonator bulk, TCF-engineering, thermal-frequency-trim and/or other engineering or device-finishing authority is unneeded.

As discussed above, layer thicknesses within the dual-silicon resonator are generally non-uniform, and chosen, for example, to yield a desired TCF characteristic (e.g., with the core single-crystal silicon layer being 30× the width of an aluminum nitride piezo layer) and bulk resonator size, aspect ratio or other dimension. Due to their disparate surface tensions, however, the material layers tend to warp when laminated into a composite stack, complicating downstream fabrication steps (and possibly producing unwanted modal characteristics or otherwise degrading runtime performance). FIGS. 13A and 13B illustrate embodiments of symmetric dual-silicon material stacks that avoid surface-tension imbalance (and resultant warping). In the embodiment of FIG. 13A, for example, after fabricating two dual-silicon/piezo-layer material stacks generally as shown, one of the material stacks is flipped and bonded to the other to yield a six-layer stack (or 5 layer if the bonded polysilicon layers are viewed as a single layer) having a line of symmetry at the bond surface. Thus, the relatively thick degenerately-doped single-crystal silicon core at the bottom of the stack is balanced by a same-height ("h1") degenerately-doped single-crystal silicon core at the top of the stack. Electrically, the stack may be viewed as a having a top and bottom electrode (formed by the counterpart degenerately-doped single-crystal silicon layers) with series-connected capacitors (the two piezoelectric material layers) coupled between those electrodes and coupled to each other through the bonded degenerately doped polysilicon layers—a series-coupled pair of capacitors, electrically equivalent to a single capacitive element having twice the elemental capacitance. One advantage of this approach, in addition to surface tension equilibrium, is the relatively tall material stack profile that results from the twin single-crystal silicon (core resonator) layers—an arrangement that may meet large-profile design specifications (e.g., 12-20 micron resonator heights or more) without requiring undue process scaling or additional material layers.

FIG. 13B illustrates an alternative symmetric dual-silicon material stack in which a layer of bondable conductive material is formed between the core single-crystal silicon layer and the piezoelectric layer, followed by formation of another such layer over the piezo layer (sandwiching the piezo layer between two films of the bondable conductive material). After surface preparation (e.g., chemical-mechanical planarization), another instance of the core silicon layer is bonded to the material stack, thus forming (absent the bottom insulator and handle wafer) a substantially symmetric material stack having the same series-coupled capacitor electrical model as the material stack of FIG. 12A. In a twist on the FIG. 12B embodiment, the piezo layer may be sandwiched between non-conductive bonding layers.

The following are at least some of the advantages that may be realized by embodiments disclosed thus far herein:

- Degenerately doped silicon can replace two separate materials used in piezoelectric resonators to date: a temperature compensation material (e.g. $SiO_2$) and an electrically conductive material (e.g. Mo). Degenerately doped silicon is capable of temperature compensation and provides sufficiently low electrical resistance (e.g. 1-50 ohms) to serve as an electrode material for many applications.
- Degenerately doped single crystal silicon facilitates improved frequency stability over temperature by allowing cancellation of both first- and second-order TCF. The doping and orientation of the degenerately doped silicon layer provide at least two degrees of freedom for cancelling at least two temperature coefficients. Examples discussed above demonstrate that first- and second-order TCF cancellation of a composite piezoelectric resonator utilizing highly doped silicon is possible and is in the accessible design space. The temperature coefficient improvements enabled by the disclosed embodiments lead to the possibility of less than +/−10 ppm of frequency variation across the industrial temperature range from −40 to +85 C. In contrast, micromechanical resonators with only first-order TCF compensation typically show +/−50 to 200 ppm variation over the industrial temperature range.
- Elimination of the oxide and metal interfaces improves the mechanical quality factor of the resonator through the elimination of layers with potentially high acoustic loss and the elimination of interfaces which each may significantly increase the mechanical dissipation of the resonator.
- Furthermore, replacement of the metal and oxide layers in the structure with a semiconductor eliminates work hardening, fatigue effects and interface effects that contribute to frequency hysteresis over temperature and frequency aging over time.
- A resonator with engineered TCF characteristics may be created out of one or more layers of material. In one layer, it is possible to cancel the first and second order TCF coefficients by design and doping, if the material has qualities similar to degenerately doped silicon. There may be one or more regions in the layer exhibiting one or more material properties. For example, a single silicon layer may possess at least one region containing at least one doping level and at least one dopant. A single material layer may possess at least one region containing at least one material type. Each of these regions may add an additional degree of freedom in the resonator TCF behavior. By adjusting the size and characteristics of these regions, it is possible to affect the nominal frequency and, the first, second, third, and higher order TCF terms.

Micromachined structures within microelectromechanical systems (MEMS) may, for various reasons, benefit from production-time or post-production heating. While conventional production-time heating within an oven or furnace may be effective where a common temperature is to be achieved across an entire MEMS wafer or batch of wafers, emerging fabrication and post-production processes occasionally require iterative heating at precise die-specific or wafer-specific temperatures. Additionally, some processes and/or products may benefit from non-uniform (or regional or local) heating not readily feasible through whole-die or whole-wafer ovenization.

In addition to the various temperature-stable and wear-resistant characteristics discussed above, the degenerately-doped polysilicon layer and/or the degenerately-doped single-crystal silicon layer of the resonator structures discussed above may be thermally cycled through joule-heating or radiant heating techniques to achieve targeted, post-encapsulation and/or post-packaging adjustment of resonator frequency—for example, adjusting the natural frequency of wafer-scale or singulated resonators to within 50 ppm, 20 ppm, 10 ppm or less of a target output frequency). More generally, on-die structures that enable heating or superheating of micromachined elements within a MEMS device (i.e., including but not limited to the above-described resonator structures) are disclosed below in various embodiments. In a first group of "contact heating" embodiments, direct-current conduction paths are established through the target micromachined structure to produce ohmic or resistive heating ("joule heating"), in some cases enabling the target element to be heated to temperatures substantially beyond the nominal MEMS operating temperature range (i.e., "superheating"). In a number of contact heating embodiments, "tether" structures that interconnect the target micromachined element to respective anchors are used to source and sink DC current and, optionally, to provide thermal isolation with respect to the anchors and device substrate. In other contact heating embodiments, one or more electrode structures formed within the material stack of a MEMS resonator (or other moveable micromachined member) are patterned to produce one or more device-heating hot spots.

In a group of "capacitively-coupled heating" embodiments, alternating current (AC) flow is generated within the target micromachined element through application of sufficiently high frequency signals to neighboring electrodes (i.e., immobile electrodes capacitively coupled to a moveable micromachined member and which, in the case of a micromachined resonant member, may serve during device operation as resonator drive electrodes and/or resonator sense electrodes). In yet other embodiments, direct or capacitive couplings to respective dielectrically separated layers of a micromachined structure are employed to convey radio frequency (RF) energy across the dielectric boundary and thus heat the separated layers. In all such embodiments, the MEMS resonator structure or portions thereof (e.g., one or more layers of multi-layered devices) may be patterned to enhance or retard joule heating effects. Also, multiple energy-delivery ports may be provided in all cases to enable localized heating of respective regions and/or layers of the micromachined member. In self-heating embodiments, programmable steering circuitry (to steer AC or DC current to a selected energy delivery port or group of ports) and/or programmable heating control circuitry (to establish a desired heating profile) may be provided on the same die as the target micromachined member or on another die within a multi-die package. In yet other embodiments, radiant heating (e.g., laser or radio-frequency heating) may be used to superheat MEMS resonator structures or portions thereof, including, for example, transmission of radiated energy through a transparent (i.e., to the relevant wavelength) lid or other structure of an encapsulated or packaged MEMS resonator. These and other embodiments and features are disclosed in greater detail below.

FIG. 14 illustrates an exemplary micromachined member (or structure) within a microelectromechanical system (MEMS) that may be heated or superheated using the various techniques and circuit configurations disclosed herein. In the arrangement shown and embodiments discussed below, the micromachined member is a moveable resonant member within a MEMS device and includes at least one degenerately doped semiconductor (DDS) layer according to the various embodiments described above. In all cases, the micromachined member may alternatively be a moveable mass within an accelerometer, a thermistor, or any other useful MEMS structure, and may lack the DDS layer. Also, the DDS layer, when present, may be implemented by doping single-crystal, polycrystalline and/or amorphous forms of silicon, germanium, etc. with a relatively high concentrations of dopant (e.g., arsenic, boron, phosphorus, antimony, etc.), for example, above 1e18 atoms/$cm^3$, 1e19 atoms/$cm^3$, 1e20 atoms/$cm^3$ or 2e20 atoms/$cm^3$. Accordingly, "DDS" should be understood to mean degenerately doped silicon as well as various other degenerately doped semiconductors including, for example and without limitation, degenerately doped germanium, 3-5 compounds, silicon-germanium etc. Degenerately doped silicon is referred to in a number of instances herein because it is the most industrially common semiconductor, but such references should not be considered limiting.

Continuing with FIG. 14, the resonant member is secured to one or more anchors by respective tethering structures ("tethers"), and may be disposed between respective drive/sense electrodes and/or have electrodes patterned within a top or intermediate layer thereof. Detail views 615, 617 and 619 illustrate a number of possible implementations of the resonant member including, a resonant structure formed entirely from DDS (e.g., degenerately doped silicon), a DDS layer having a layer of piezoelectric material disposed thereon, and a piezoelectric layer sandwiched between a DDS layer and an electrode layer. In the latter three-layer implementation, the electrode layer may include one or more electrically conductive electrode regions isolated from one another by a dielectric (as shown), or merged into a consolidated electrode or electrode layer.

FIG. 15A illustrates a profile view of an exemplary MEMS device having a DDS resonator (an example of a moveable micromachined or microelectromechanical member) together with structural interconnections that permit production time joule heating. In the contact-heating embodiment shown, the DDS resonator is secured between anchors by way of multi-functional tethers. That is, the tethers serve not only to mechanically secure the DDS resonator to the anchors (and thus to the device substrate), but also as electrical conductors for joule-heating current ($I_{JH}$) and, in some implementations, as a thermal isolator between the DDS resonator and the anchors.

The anchors themselves may be implemented by or layered with electrically conductive material and thus conduct the joule-heating current from wafer probes or singulated die probes. More specifically, prior to device encapsulation a voltage source (or current source) established between the two probes (i.e., potential in either case indicated by v+ and v−) produces a joule-heating current flowing from left-to-right in the example shown—through the leftmost anchor and tether, through the DDS resonator and then exiting through the rightmost tether and anchor, joule heating the tethers and DDS resonator. Although a DC current is show in FIG. 15A (and other Figures below), alternating currents may also be conducted through the DDS resonator.

FIG. 15B illustrates a post-encapsulation joule-heating MEMS embodiment in which electrically conductive vias extend through a hermetically encapsulating lid arrangement to make electrical contact with electrically conductive anchoring structures (i.e., anchors formed from or layered with electrically conductive material as in FIG. 15A). By this arrangement, joule heating current may be driven through the DDS resonator during post-encapsulation finishing operations, or even post-production, including joule-heating in the field before or after the MEMS device has been deployed within a host system. FIG. 15C illustrates an alternative embodiment in which electrically conductive vias extend through the device substrate (e.g., bulk semiconductor) to enable joule-heating current flow through the DDS resonator. Note that, in the embodiments of both FIGS. 15B and 15C, the hermetic encapsulation may, together with a perimeter seal ring or like structure, enclose a vacuum cavity or a cavity filled with inert, thermally isolating material, thus limiting heat radiation from the DDS resonator to the substrate and lid.

FIGS. 16A-16C illustrate embodiments of multi-functional tether structures, showing examples of a bulk tether (FIG. 16A), a composite tether (FIG. 16B), and an extended-path tether (FIG. 16C). In general, the thermal and electrical resistance of a given tether structure are inversely proportional to its cross sectional area, whereas the mechanical rigidity imparted by the tether (i.e., to secure the moveable micromachined member with respect to the anchor) increases with cross-sectional area. In the bulk tether embodiment of FIG. 16A, the tether's width (W—a proxy for cross-section area in embodiments having a fixed depth dimension according to the micromachined member depth) is selected in accordance with the tether's material thermal and electrical conductivity and distance spanned (D) to yield a desired electrical and thermal resistance, as well as a desired mechanical rigidity. For example, the electrical and thermal resistance of the tether may be engineered to achieve a desired temperature range within the tether itself, thus providing a thermal barrier (thermal isolation) between the heated or superheated moveable micromachined member and the ambient temperature (or near-ambient) anchor and substrate.

In the embodiment of FIG. 16B, the "composite" tether is implemented by a collection of N component tethers (N>1), each sized to yield a desired cross-sectional area in view of the distance spanned, and to provide a degree of thermal isolation and mechanical rigidity. Depending on the intended motion of the moveable micromachined member (e.g., different possible vibrational modes in a resonant member), the decomposition of a bulk tether into multiple component tethers as shown in FIG. 16B may provide enhanced motional freedom, without unduly compromising mechanical support. Decomposition of a bulk tether into multiple component tethers that collectively occupy the same footprint as the bulk tether reduces the cross-sectional area of the composite tether (as compared to a counterpart bulk tether), thus raising electrical and thermal resistance so that higher tether temperatures may be achieved for the same joule-heating current and fabrication material—a result that may enable higher temperatures to be achieved within the target micromachined member.

In the embodiment of FIG. 16C, the tether structure is routed laterally in a direction orthogonal (perpendicular) to the spanned distance and folded back on itself, thus extending the electrical and thermal pathway between the anchor and moveable micromachined member such that substantially higher temperatures and potentially greater thermal isolation may be achieved. In the particular implementation shown, the tether includes symmetric lateral extensions or folds (i.e., extending by lateral distance L in both directions relative to the span axis). By this arrangement, and by choosing the collective lateral extension distance (2*L, where '*' denotes multiplication) to approximately match the width of the moveable micromachined member (or at least the width of the anchor), the tether presents an effective thermal barrier between the moveable micromachined member and the anchor. Note that the lateral extension dimension of the folded tether may be only a fraction of the moveable member width in alternative embodiments (e.g., ¼ or ⅓ of the moveable member width, though small or larger fractions may be implemented) in which case multiple composite folded tethers may be deployed. Also, as explained above, the width of the tether (W, which may be uniform throughout the roots and lateral extensions of the tether or may be narrower in one or the other), may be engineered to yield a desired thermal and electrical resistance and thus produce a relatively high temperature within the tether increasing the tether's efficacy as a thermal isolator (e.g., the ratio of L to W may be set to 2, 3, 4, 5 or higher, or to any fractional value between those integer ratios). Further, the U-shaped geometry of each lateral (folded) extension provides a degree of mechanical compliance (yet another function performed by the tether), compressing and expanding with motion of the micromachined member. Thus, the tether shown in FIG. 16C serves to mechanically secure the moveable micromachined member to the anchor, provide an electrical pathway for joule heating, thermally isolate the moveable micromachined member from the anchor and provide a spring-like mechanical compliance between the micromachined member and anchor. In alternative embodiments, the lateral extension dimension, L (which may be smaller than, approximately or nominally equal to or larger than the span distance, D) may be larger or smaller than that shown (e.g., extending beyond the outline of the moveable micromachined member) and the shape of the lateral extension may be different (e.g., curving radially in a semicircle or semi-ellipse instead of bending/folding to form a U-shape). Also, instead of symmetric lateral extensions, the tether may exhibit a single lateral extension (i.e., in only one direction relative to the span axis). Similarly, instead of a single tether with symmetric lateral extensions and folds, the MEMS device may include two single-fold tethers with oppositely directed lateral extensions (i.e., as though the depicted tether was split in two along the span axis), or even multiple pairs of such folded tethers, with the fold of a given tether encompassed within the fold of another.

FIG. 16D illustrates an exemplary thermal profile achieved by conducting a DC or AC joule heating current through a moveable micromachined member via anchors and folded tethers. Due to the higher electrical resistivity of the tethers relative to the anchors and, at least in some cases, the moveable micromachined member, joule heating occurs predominantly within the tethers themselves, resulting in conductive and possibly radiant heating of the moveable micromachined member (where joule heating may also occur). The tethers also thermally isolate the moveable micromachined member from the ambient or near-ambient temperature (To) anchors during joule heating so that, in a vacuum environment at least, the nominal tether temperature at the tether's physical midpoint (i.e., between the anchor and micromachined member) rises to $T_0+T_{JH}/2$, and the moveable micromachined member is heated relatively uniformly throughout to a temperature $T_0+T_{JH}$. Other temperature profiles (including those having nonlinear gradients) may be produced in alternative embodiments. The moveable micromachined member may be slightly cooler than the hottest part of the tethers dues to radiative dissipation or gas conduction, but will usually be near the highest temperature of the tethers. The temperature profile can be accounted for in the design and trim process.

FIG. 17 illustrates another joule-heating MEMS embodiment, in which respective pairs of "flexible" tethers are provided to conduct joule-heating current to the moveable micromachined member, with each such tether pair thus forming a dedicated heating port. In this arrangement, the mechanical tethers serve to connect the micromachined member to the anchors (two of which are shown, though a single-anchor arrangement is also possible) and provide a desired mechanical rigidity, while the flexible tethers may be designed to be relatively "soft" or even as soft as possible so as to minimize damping of vibrational or inertial motions of the micromachined member. Also, provision of multiple flex-tether pairs makes it possible to heat or superheat respective regions of the micromachined member non-uniformly, an effect that may be useful in some applications. More or fewer heating ports (flex-tether pairs) may be provided in alternative embodiments, including heating ports that drive currents across corners, individual layers, or other more isolated regions of the micromachined member.

FIGS. 18A and 18B illustrate exemplary capacitively-coupled driven heating arrangements in which electrodes that serve as drive and/or sense electrodes (e.g., within a MEMS resonator or accelerometer) double as radio-frequency (RF) energy inputs that drive AC joule-heating currents within a moveable micromachined member. In the embodiment of FIG. 18A, for example, a RF energy source is supplied to both electrodes, while a complementary phase of the RF signal (or a steady state neutral voltage set, for example, at the mid-point between the upper and lower peaks of the RF signal) is coupled to one or more multi-function tethers, thus effecting an alternating current flow into and out of the moveable micromachined member via the multi-function tether. That is, energy is transferred from the RF energy source to the micromachined member via the capacitive coupling between the electrodes and the micromachined member, with charge carriers alternately being expelled from and drawn into the micromachined member via the multi-function tether (i.e., AC current).

In the embodiment of FIG. 18B, the complementary phases of the RF energy source (or RF signal and neutral voltage) are coupled alternately to the two electrodes so that the electrodes are driven differentially to produce an AC current flow therebetween (i.e., charge carriers being alternately compelled across the moveable micromachined member toward one electrode and then the other). In such an embodiment, the mechanical tether (or tethers) may be electrically nonconducting (if conducting and coupled to a fixed-potential substrate via electrically conductive anchors, AC current will flow as in FIG. 18A) and are generally engineered as discussed above to provide thermal isolation with respect to anchor structure(s) which have temperatures at or near the ambient temperature surrounding the die or wafer.

FIG. 19A illustrates yet another joule heating embodiment in which energy is supplied conductively (e.g., via electrically conductive tethers as discussed above) or capacitively (e.g., via capacitive electrodes as discussed in reference to FIGS. 18A and 18B) to respective layers of a multi-layer device. In the particular example shown, the upper electrode layer and bottom DDS layer sandwich an interior dielectric layer (e.g., a piezoelectric material) so that the outer layers may be viewed as forming respective resistances through which DC or AC joule-heating currents pass.

FIG. 19B illustrates an alternative heating arrangement in which joule-heating is sourced primarily within a patterned electrode layer of a dual-silicon resonator (i.e., degenerately-doped poly layer and degenerately-doped single-crystal silicon layer with piezo layer sandwiched between the silicon layers). The tethers may still be structured to provide thermal isolation between the resonator and anchoring field areas, but are otherwise sufficiently conductive such that the predominant joule-heating voltage drop (and power dissipation) occurs within the patterned electrode layer. In the particular example shown, the patterned electrode (e.g. implemented in one or both of the degenerately doped silicon layers-single-crystal silicon and/or polysilicon, with the latter arrangement depicted) includes a relatively narrow conductive passage extending between larger bulk interconnect nodes. Due to its relatively low cross-sectional area (and correspondingly higher resistance), the narrow passage constitutes the predominant source of ohmic ($I^2R$) power dissipation within the conduction path traversed by the joule-heating current and thus the predominant joule-heating source. As with the tether-based heating arrangement of FIG. 16D, the resonator may be heated relatively uniformly to a target temperature (e.g., $T_0+T_{JH}$) with limited thermal radiation from the resonator to the substrate and lid structures. More generally, patterned-electrode joule heating may produce, alone or in combination with other joule-heating or radiant heating sources, a temperature profile different from the example in FIG. 16D, including generation of local or non-uniform temperature distributions.

FIG. 20 illustrates another embodiment in which an RF energy source is coupled across the outer (at least somewhat electrically conductive) layers of the moveable micromachined member shown in FIG. 19A. By this arrangement, AC currents are generated in the electrode and DDS layers of the micromachined member to enable heating or superheating of those layers.

FIG. 21 illustrates an encapsulated or chip-scale MEMS package having a MEMS die (e.g., with a moveable micromachined member formed thereon) and a control die. As shown, the control die includes a number of low-power control signal interconnects that convey relatively low-power run-time control signals and output signals between the two dies (or dice), as well as relatively high-power heat-energy interconnects that enable delivery of joule-heating energy in the form of DC or AC power signals. Although a single heat-energy interconnect pair is shown, more interconnects may be provided in embodiments having multiple heating ports. Also, while the heat-energy interconnects are shown as extending between the control die and the MEMS die, the heat energy interconnects may alternatively or additionally be exposed to a surface of the package to enable power delivery from an external heating controller. Further, the heat energy interconnects between the MEMS die and control die may be omitted in favor of energy input interface on the MEMS die that is accessed pre- or post-encapsulation as discussed above (i.e., MEMS die heating is carried out prior to packaging with control die). Electrical vias and contacts that are sized for superheating may be larger in lateral dimension than their counterparts that are designed for normal operation. For example, electrical vias for normal operation may be 5-15 microns in diameter to minimize parasitic capacitance. In contrast, vias that are sized for superheating may range, for example and without limitation, from 20-100 microns in diameter to minimize resistive heating in the via. The via may be in contact with a low melting temperature material (such as aluminum or titanium) and thus the via temperature increase should be limited. Furthermore, the electrically conductive material in the vias may have a lower electrical resistivity than would otherwise be required for normal operation, such as DDS rather than a lightly doped semiconductor.

Still referring to FIG. 21, programmable heating control circuitry may be provided within control die to enable in-situ post-production heating or superheating of micromachined member(s) within the MEMS die. In such an embodiment, the control die may also include a programming interface (i.e., signaling interface) accessible via external contacts of the MEMS package. Accordingly, an external controller (e.g., dedicated and disposed in-situ with the MEMS package within a host system, or a standalone production or post-production controller) may be coupled to the programming interface to issue programming instructions and operands as necessary to configure the programmable heating control circuitry and thereby initiate and control heating/superheating of one or more micromachined members within the MEMS die.

FIG. 22 illustrates an embodiment of a programmable heating controller that may be used to implement the programmable heating control circuitry of FIG. 21. As shown, the heating controller includes a number (N) of programmable register banks that supply respective sets of programmed parameters to a power driver circuit. The power driver circuit, in turn, drives power signals (i.e., serving as a voltage or current source) to respective heating ports in accordance with the parameters programmed within the corresponding register bank. In the particular example shown, each programmable register bank includes a set of register fields (any or all of which may be implemented by individual registers) to store respective parameters that control the amplitude, duration and frequency of voltage or current pulses output by the power driver via the corresponding heating port, as well as a port enable field that enables the heating port to be selectively engaged or disabled.

FIG. 23 illustrates an arrangement in which multiple heating-power drivers within an external heating controller may be coupled to respective singulated or on-wafer MEMS devices, thus enabling concurrent execution of various heating and superheating operations described above with respect to the subject MEMS devices. The external heating controller may be implemented, for example, within a production or testing device (e.g., within automated test equipment (ATE)) that may perform numerous other functions related to or independent from MEMS device heating/superheating.

Figures 24A, 24B, 25:
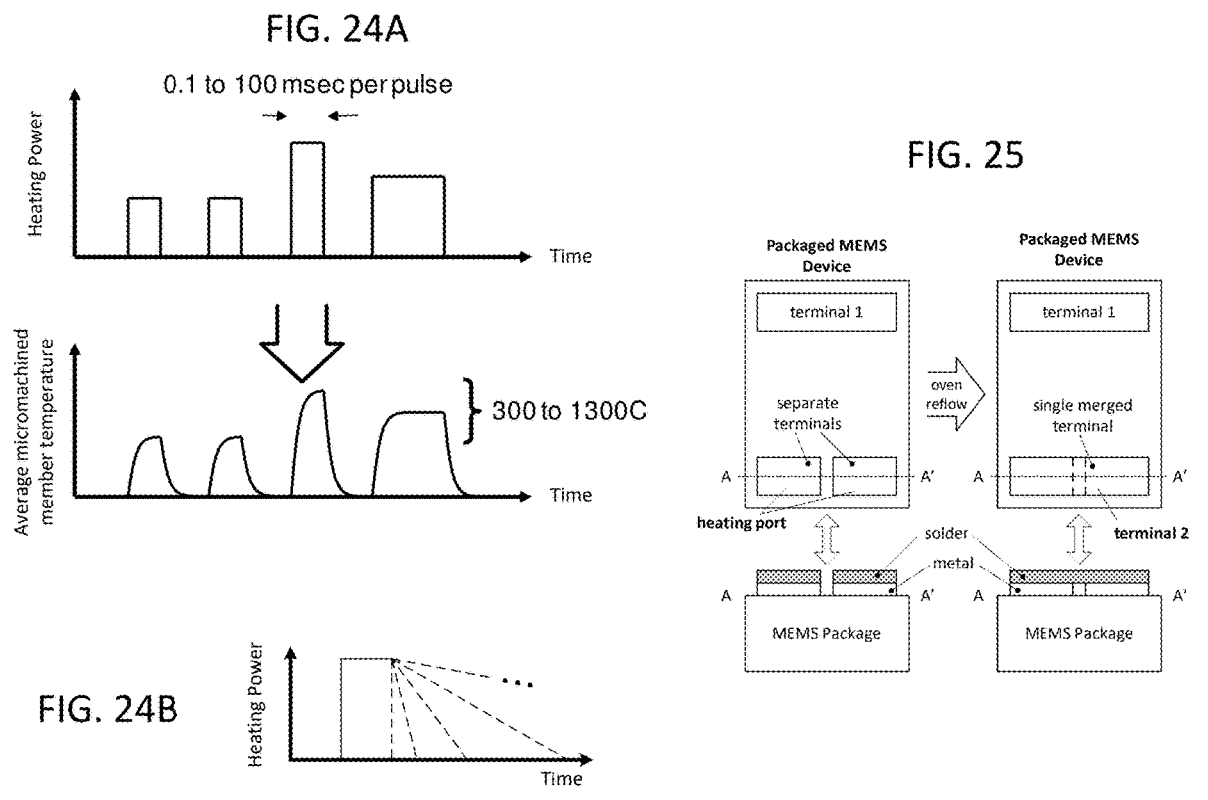

FIG. 24A illustrates an exemplary heating power profile that may be produced within the external or in-situ heating controllers of FIGS. 22 and 23, together with exemplary temperatures produced within a moveable micromachined member (i.e., within a MEMS device or package). In the particular example shown, pulses of various width (duration in time) and amplitude (power) are produced, with the net energy delivery proportional to approximately to the area under the pulse. More specifically, pulse durations may be varied from at least 0.1 mSec to 100 mSec (shorter and/or longer pulse durations may be implemented in alternative embodiments) and power levels may range at least from 20 mW to 500 mW (higher and/or lower limits may be supported). Temperatures produced within moveable micromachined elements during heating/superheating operations may substantially exceed nominal MEMS run-time operating temperatures, ranging from 300 to 1300 degrees Celsius in the exemplary thermal profile shown, though higher and/or lower temperatures may be achieved (e.g., lower temperature limit of 500, 600, 700 or 800 degrees Celsius).

Though not specifically shown in FIG. 24A, pulse frequency may also be varied in accordance with heating control parameters (e.g., as discussed in reference to FIG. 22). Also, as shown in FIG. 24B, the power pulse waveform may be shaped to achieve a controlled cooling profile, for example, by selecting between various power-down ramps rates. Thus, if a slower cool-down rate is desired, a longer (flatter-slope) power-down ramp may be selected, while, conversely, if a faster cool-down rate is desired a shorter (steeper-slope) power down ramp may be chosen. Selected power-down ramp rates may be applied to all power pulses (in which case different ramp-rates may be applied to respective pulses) or only the final pulse or final few pulses in a heating (power pulse) sequence. Further, while linear power-down ramps are shown, any or all of ramps may have non-linear profiles (e.g., exponential or hyperbolic profiles). Also, while controlled power-down profiles are shown, the rising edges of power pulses may similarly be shaped according to achieve controlled heating rates. In all cases, power profiles other than (or in addition to) the pulsed profiles shown may be used to effect device heating operations, including, for example and without limitation, steady-state or non-return-to-zero power profiles.

The electrical circuitry used to heat a structure may also sense the structure's temperature. The electrical properties of the structure will generally be a function of the temperature, for instance the resistance may increase with temperature. This may be used to measure the temperature before or after trimming. This may also be used to measure the structure temperature between heating pulses or even during a heating pulse. In this way a pulse duration or height, or other power profile characteristic may be modified prior to or while it is in progress in order to obtain optimal results. For instance if a tether has a specific resistance when cold and another resistance when it is at a desired hot temperature, then a current pulse may be applied until the desired hot temperature is reached. The structure's resistance can be measured at the same time as heating with various means, for instance by applying a current to heat the structure, while measuring the voltage across the structure to determine its resistance, or alternately by applying a DC heating drive while measuring resistance with an AC test signal.

FIG. 25 illustrates an exemplary processing of packaged MEMS device in which an oven reflow operation is executed to merge two separate terminals that form a heating port into a single operational terminal. That is, prior to oven reflow, the packaged MEMS device includes three electrically isolated terminals, two of which form a port for heating or superheating an internal micromachined structure as discussed above, while the other forms a first operational terminal. As respective solder layers (or layers of other heat-soluble electrically conductive material) of the two heating port terminals are rendered fluid during oven reflow and flow together, the two heating port terminals are effectively merged to form the second of two operational terminals (i.e., converting the MEMS device from a three-terminal device to a two-terminal device). This same approach may be carried out with respect to the first operational terminal (e.g., reflowing to merge distinct terminals that may constitute a second heating port into the first operational terminal) or other terminals not shown.

FIG. 26 illustrates an exemplary heating port arrangement within a packaged MEMS device having two front-side terminals ("terminal 1" and "terminal 2"). In the particular embodiment shown, the backside of a chip-scale package (CSP) is electrically coupled to an electrode layer in a moveable micromachined member (e.g., resonant member as shown at 119 in FIG. 1) via a tethering structure and thus forms a third terminal referred to herein as the "backside terminal" ("Terminal 3"). One of the front-side terminals is electrically coupled to the same electrode layer as the backside terminal via another tethering structure, so that the tether-interconnected front-side terminal and backside terminal form a heating port through which an AC or DC joule-heating current may be conducted. An exemplary circuit model of this joule-heating operation is shown in FIG. 27A, illustrating a current $I_{JH}$ flowing through a pair of tethers (each modeled as $R_{tether}$) and also through one or more layers of the moveable micromachined member. Electrical current from terminal 1 to the bottom (DDS) layer of the micromachined member also passes through one or more tether structures, which may be the same tether structures that conduct the joule-heating current. Note that while equal tether resistances ($R_{tether}$) are shown for all terminal connections, the tether resistances may vary from layer to layer, even where a shared tether is used. For example, the cross-sectional area (width and/or height) of the tether and/or electrical conductivity of the tether may be non-uniform with respect to its connection to different layers of the micromachined member.

Still referring to FIG. 26, the capacitor between terminal 1 and terminals 2/3 represents a piezoelectric or other dielectric film in the moveable micromachined member, in this particular example. Although a DC current source is coupled across terminals 2 and 3 to produce the joule-heating current (e.g., during production or post-production processing) in the depicted arrangement, a DC voltage source or AC voltage or current source may alternatively be used. Also, after dicing a wafer (i.e., wafer containing multiple such MEMS structures as shown in FIG. 26) into individual dies, the backside of each die may still be electrically coupled to one of the front-side terminals (i.e., through the resistances of the tethers and moveable micromachined member). In many applications, this residual electrical coupling (i.e., between backside and front-side terminals) has no (or negligible) impact on device operation and may be left intact. In applications that require or benefit from electrical isolation between the device backside and front-side terminals during device operation, a fusible or otherwise break-able connection to the backside terminal may be employed to enable post-production abolishment of the backside terminal.

The two front-side terminals shown in FIG. 26 are utilized for normal device operation. In this example, the capacitor represents a piezoelectric layer as in the case of a dual-silicon piezoelectric MEMS resonator shown in FIG. 1A. During normal device operation, only one connection to each electrode layer in the MEMS structure (i.e., micromachined member) is required so that the backside of the MEMS die (terminal 3) may be unused. In the exemplary model shown, the backside terminal is permitted to float electrically so that no (or negligible) joule-heating current flows within the moveable micromachined member. This operation is shown in FIG. 27B In alternative embodiments, the backside terminal may be abolished as discussed above. Also, as with all embodiments herein, micromachined members may be implemented/fabricated with more or fewer than the three layers than shown in FIG. 26.

FIGS. 28A and 28B illustrate exemplary electrical interconnections between encapsulation-level TSVs (through-silicon-vias extending, for example, through an encapsulating lid structure or substrate) and piezo-actuated resonator electrodes that enable both package-level terminal interconnection (i.e., during subsequent packaging steps) and post-encapsulation joule-heating of the MEMS resonator. In the embodiment of FIG. 28A, three terminals are exposed at TSVs through the lid and/or substrate layer of the encapsulated dual-silicon resonator—two terminals coupled to opposite lateral ends of the top electrode (shown as an ISDP layer, though any of the alternative material layer configurations may be used) and one terminal coupled to the bottom electrode (a degenerately doped single-crystal silicon layer in this example). By this arrangement, a direct or alternating current may be passed, for example, through the tethering structures of the resonator and top electrode layer, either or both of which may be designed to superheat the resonator material stack (i.e., joule-heat the resonator material stack as discussed above) and thus carry out any number of post-encapsulation annealing operations and/or thermal frequency trim operations. The embodiment of FIG. 28B is similar to that of FIG. 28A, except that the joule-heating terminal pair is tether-coupled to opposite lateral ends of the bottom electrode layer (e.g., degenerately doped single-crystal silicon layer) to operate the bottom tethering layer and/or bottom electrode layer as the superheating source instead of the top-layer tether/electrode elements. In yet other embodiments, two joule-heating terminal pairs may be provided, with each coupled to opposite ends of a respective degenerately-doped silicon layer. Also, as discussed in greater detail below, the joule-heating terminal pair in either of the FIG. 28A/28B embodiments may be merged to form, together with the third encapsulation terminal, the resonator sense/drive terminals discussed in reference to FIG. 1A. Alternatively, the joule-heating terminal pair may be driven by equipotential resonator-drive signals to emulate an electrical coupling of the terminal pair. That is, instead of wiring the terminals together to establish an equipotential at the lateral ends of the relevant material layer (and tethering layers), the terminals may be driven to an equipotential by a drive/sense circuit of an attached logic die.

FIGS. 29A and 29B illustrate a terminal reduction approach in which three or more encapsulation-level terminals (e.g., as discussed in reference to FIGS. 28A and 28B) are merged prior to enclosure within a package housing to expose only two electrically independent package-level terminals. In the conceptual diagram of FIG. 29A, the joule-heating terminals (joule-heating port) are coupled to an ISDP layer of a dual-silicon resonator (thus permitting introduction of joule-heating current through wafer probes or singulated die probes), but may alternatively be coupled to the core single-crystal resonator layer or supplemented by an additional heating port coupled to the core resonator layer (i.e., in a four-terminal encapsulation structure).

FIG. 29B illustrates an exemplary sequence of packaging operations to yield the intra-package terminal merger (reduction) shown in FIG. 29A, showing cross-sectional and top views of the encapsulated structure or packaged structure at each point in the sequence. Starting with an exemplary three-terminal encapsulated structure, the two joule-heating terminals are merged by a metal deposition to form a unified top-electrode terminal (or bottom-electrode terminal). Thereafter, an additional packaging layer (e.g., polyimide or other non-conductive molding or material layer) is disposed over the merged electrode terminals with through-vias and solder-ball sockets formed as shown to yield a four-terminal package in which two of the package-level terminals are electrically common (per the terminal-merging metal deposition) to form top electrode interconnect nodes, and a third of the four terminals is coupled to the bottom electrode (or vice-versa). The fourth package-level terminal is provided primarily for mechanical stability and may be left unconnected ("no connect" or "NC") or redundantly coupled to the bottom or top resonator electrode. In yet other embodiments, particularly where an oblong packaging structure is desired, only two package-level contacts may be exposed-one for each of the two resonator electrodes.

In resonator-based systems for timing, sensing, or other applications, it may be desirable to calibrate resonant frequency at or near room temperature to compensate for variability in the resonator manufacturing process. For example, the room-temperature resonant frequency of an uncalibrated resonator may differ from its desired frequency by +/−10,000 parts per million (ppm) compared with typical application requirements on the order of +/−20 ppm or less.

The offset between the desired and actual resonant frequency can be eliminated through active compensation (i.e. continuous correction) or through passive compensation (i.e. one-time correction or "trim"). Active compensation methods are undesirable in that they require dedicated electronic circuits, consume electrical power, and the compensated frequency output may be noisier than the uncompensated resonator frequency.

It is advantageous to perform frequency calibration once the resonator is already hermetically packaged for several reasons. First, it can be performed in a non-cleanroom environment which lowers costs. Second, the packaging process can slightly shift the resonator frequency which degrades the accuracy of the frequency trimming process.

Although passive compensation techniques have been developed to trim the room temperature frequency of MEMS resonators, for example through mass removal/addition via laser irradiation or surface chemical reaction, they have several limitations when applied to hermetically packaged resonators (e.g., package damage, particulate generation within the sealed cavity, introduction of chemically reactive material in sealed cavity, increased cavity pressure, increased process complexity/cost, etc.).

In a number of embodiments disclosed herein, the various joule-heating structures/techniques discussed above and/or alternative heating techniques (e.g., superheating by laser or other electromagnetic radiation) are applied to effect thermal frequency trim operations. More generally, applications of superheating methods include the modification of one or more resonant frequencies or other resonant device characteristics based upon material property modification—a modification distinct from the material removal, ablation, dimensional change, or surface modification described above. Although these latter modifications can occur as a side consequence of the heating to change material properties, they are not the primary mechanism though which the frequency trimming is effected. One or more superheating cycles in a sequence may be utilized to manipulate the resonant frequencies of a MEMS structure. These and other thermal trim embodiments and features are disclosed in greater detail below.

Figures 30, 31A, 31B:
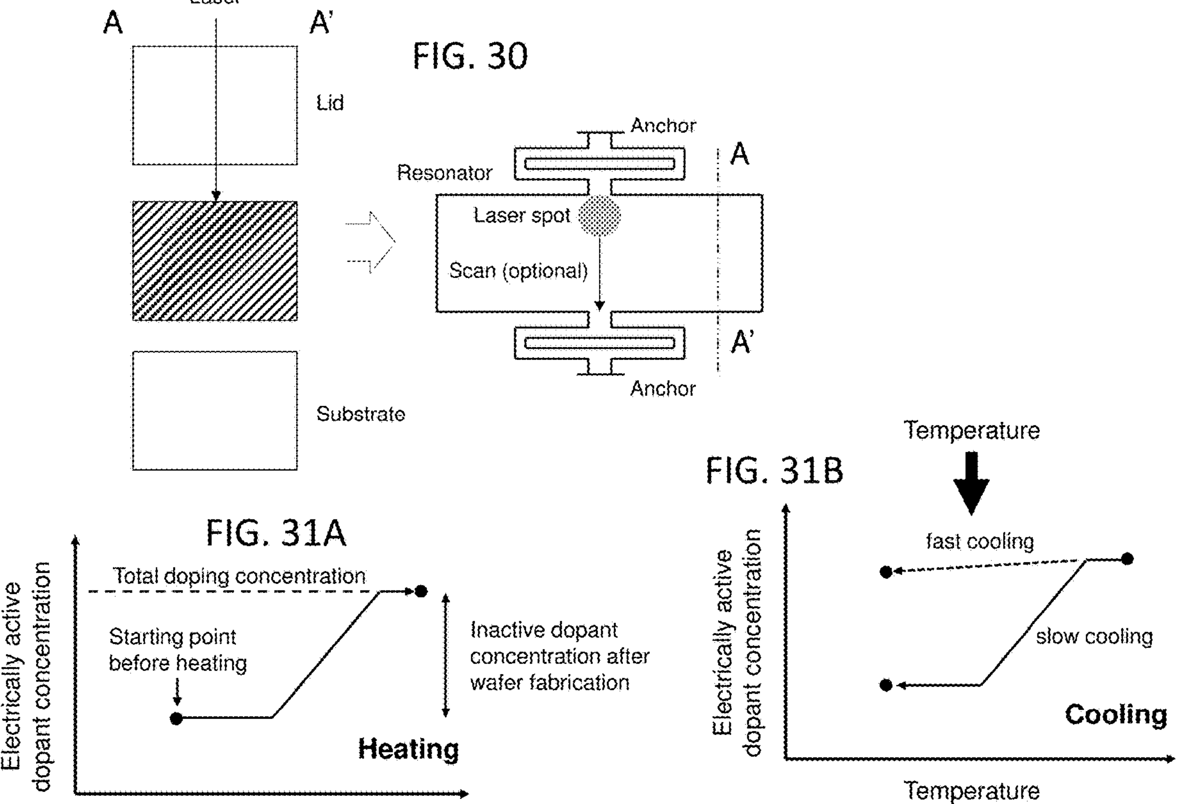

FIG. 30 illustrates an exemplary heating of a MEMS resonator via a laser (e.g., continuous wave or pulsed lasers with wavelengths ranging the ultraviolet to the infrared) or other source of electromagnetic radiation. The MEMS resonator may optionally be hermetically encapsulated before frequency modification so that encapsulation-induced frequency shifts are compensated out. The hermetic enclosure can be made of silicon, glass, alumina, or other materials having minimal optical absorption in certain wavelengths in comparison with the DDS containing MEMS structure. For example, an IR laser (for example, 1.1 micron wavelength) can be combined with a lightly doped silicon hermetic enclosure (for example, 1e17 atoms/$cm^3$) so that absorption of the DDS layer in the MEMS resonator (e.g., implemented by a dual-silicon resonator or variants as described above) is substantially larger than the lightly doped silicon enclosure. The laser can heat the resonator while leaving the hermetic encapsulation relatively undamaged. In the case of a laser beam, the spot size can be substantially round or in an alternative shape through optical manipulation. The spot size will typically be significantly smaller than the MEMS structure, although in some cases it may be beneficial to use a laser spot that is comparable in size to the structure. The laser spot may be applied to one or more discrete positions on the structure or it may be scanned to heat a specific area, shape or pattern.

In the case of heating via electromagnetic radiation, the DDS layer may perform two functions: frequency tuning through stiffness modification and optical absorption. Alternatively, the DDS layer can be utilized for only a single function (optical absorption) and the frequency of the MEMS structure can be modified though laser ablation, resulting in a geometry change that leads to a stiffness decrease or a mass decrease depending on the spatial distribution of ablation. The optical power may be spatially patterned across the MEMS structure, for example to independently engineer the room temperature frequency of two or more modes or to independently control two or more temperature coefficients of frequency.

In laser-based heating methods, the tethers perform two functions (thermal insulation/isolation and mechanical compliance) and their third potential function of providing relatively high electrical resistance is less important. The heating power source is at the point of laser incidence, rather than in the tethers or patterned-electrode hot spots as in the case of joule heating.

FIGS. 31A and 31B illustrate manipulation of electrically active dopant concentration through heating and cooling processes applied to the MEMS resonator structure. The total dopant concentration in a semiconductor is the sum of the electrically active and the electrically inactive dopant concentrations. In DDS materials, the electrically active dopant concentration at the completion of wafer-scale processing may be significantly lower than the total dopant concentration via numerous mechanisms of dopant inactivation.

The fabrication process of the DDS can be engineered so that a significant concentration of dopants is electrically inactive at the completion of the wafer fabrication process. The inactive dopant concentration can be controlled through selection of the dopant species (e.g. arsenic, boron, phosphorus, or antimony), the dopant dose per unit area, the dopant concentration distribution, or the thermal processing parameters applied to the resonator (e.g. time, temperature, heating rate, cooling rate).

FIG. 31A illustrates the electrically active dopant concentration after such a DDS sample (e.g., degenerately-doped single-crystal silicon, or degenerately-doped polycrystalline silicon) is heated. The electrically active dopant concentration does not change significantly at low temperatures (for example, below 200° C.) but increases significantly at higher temperatures until a significant fraction or potentially substantially all of the previously inactive dopants have become thermally activated. The maximum heating temperature may range anywhere from 600° C. to 1300° C.

FIG. 31B illustrates two potential scenarios for the electrically active dopant concentration as the DDS is cooled. For sufficiently slow cooling rates (for example, 1° C./min) the electrically active dopant concentration will decrease as dopants deactivate, such as through the formation of inactive clusters in the case of phosphorus doping. After cooling slowly to room temperature, a significant fraction of the dopant atoms may be inactive. In contrast, if the DDS is rapidly cooled ("quenched") at a rate on the order of 104° C./sec (lower or high cooling rates may be effective), relatively few dopant atoms will deactivate. Subsequent heating to a lower temperature or a slower cooling rate may be utilized to decrease the electrically active dopant concentration, allowing the dopant concentration to be increased or decreased. Cycles of heating followed by rapid cooling ("heating cycles" or "superheating cycles" or "heating/quenching cycles") may thus be utilized to manipulate the electrically active dopant concentration in a DDS.

FIG. 32A illustrates the relationship between resonant frequency and the electrically active dopant concentration of a DDS. The electrically active concentration of carriers in a DDS can modify both its stiffness at room temperature (e.g. $c_{11}$, $c_{12}$ and $c_{14}$ coefficients in silicon) and its $1^{st}$, $2^{nd}$ and higher order temperature coefficients of stiffness. Thus, a modification to the electrically active dopant concentration of a DDS can be utilized for frequency trimming.

FIG. 32B illustrates the variation in the room temperature resonant frequency with heating time and heating temperature. The rate of frequency change varies exponentially with heating time, and typically saturates to a steady-state frequency for sufficiently long heating time. An increase in the heating temperature is typically associated with a decrease resonant frequency. However, as noted earlier, after heating the MEMS device to a particular temperature, subsequently heating the device to a lower temperature can potentially reduce the active dopant concentration (increase the resonant frequency), a technique referred to herein as "backtuning".

Temperature-activated material modification of a MEMS structure is not specific to a particular transduction technique. For example, it can be readily applied to electrostatic, piezoelectric, piezoresistive, or magnetically transduced devices. Similarly it is not specific to Joule heating or laser-based heating. Any other heating method that can controllably heat the MEMS structure to sufficiently high temperature may be applied. In the case of laser-beam heating, in some cases it may be advantageous to situate the laser beam in regions that are not covered by electrodes, if electrodes are placed on the resonator. For example, a piezoelectric resonator may use electrodes on the resonator. The resonator may be engineered to situate special regions of interest, such as regions that experience high strain or large movement in a vibrational mode, away from the electrodes to avoid damaging the electrode surface with laser illumination.

FIG. 33 illustrates an exemplary sequence of heating (power) pulses that are sequentially applied to a MEMS resonator to iteratively modify its resonant frequency. In this particular example, after three similar heating pulses are applied to the structure the frequency has saturated and is no longer decreasing. The heating power and duration of the fourth pulse are increased and a further decrease in resonant frequency is realized.

The temperature of the MEMS structure during the thermal process can be controlled by varying the applied power and/or duration of the applied power level. For example, applying a thermal pulse with a duration of 1 nanosecond (nsec) to a MEMS structure with a characteristic thermal time constant of 1 millisecond (msec) will result in a much lower maximum temperature than a 100 millisecond pulse, because in the former case the structure will not have reached thermal equilibrium. The thermal time constant of the MEMS structure can be engineered through the geometry or materials from which the structure is composed.

FIG. 34 is a flow chart that illustrates an example frequency trimming procedure or algorithm. The routine begins by measuring the resonant frequency of the resonator at one or more temperatures. The temperature can be adjusted using an external source or by passing electrical current through the device (i.e., any of the radiant heating or joule-heating techniques disclosed above and more generally, any practicable technique for heating the MEMS structure). If the resonator is not behaving as desired, the heating power, duration of exposure, and spatial distribution of the thermal process are computed to alter the resonator characteristics. The thermal process is applied to the MEMS structure, for example through Joule heating or laser irradiation. After waiting briefly for the MEMS structure to reach a desired temperature, such as the temperature of the surrounding room, the resonant frequencies are measured again to determine if the desired behavior has been achieved. The resonant frequency may be measured while the resonator is at high temperature, however there will be a resulting offset between the measured frequency and the room temperature frequency. Thus is preferable to measure the resonator frequency at a temperature that is representative of the target application.

In practice, frequency trimming consists of multiple repeated cycles (iterations) of measuring the resonant frequency of one or more eigenmodes at one or more temperatures and then applying a thermal process to the MEMS structure to impart a change in the room temperature frequency or TCF of one or more modes. It possible to independently modify more than one parameter (e.g. frequencies of two different resonant modes, or room temperature frequency and 1$^{st}$ order TCF, etc.) by varying either the thermal process characteristics (e.g. maximum temperature or duration) or the spatial distribution of the thermal process (e.g. laser position, alternating current frequency, or active electrical terminals). In the heat-measure cycle of which each iteration is composed, it is beneficial but not necessary to wait sufficiently long after the heating cycle for the MEMS structure to have cooled back to the ambient temperature or to a known temperature before measuring the frequency. The temperature of the MEMS structure may be inferred by passing a relatively small electrical current through the structure to measure its electrical resistance, which varies with temperature. Alternatively, various optical or other non-contact temperature measurement techniques may be used to determine the superheating temperature (e.g., vibrometer to ascertain resonator frequency as power pulses are applied) and/or in-situ temperature-sensing structures may be used to determine the superheating temperature. However sensed, the superheating temperature may be fed back to heating control circuitry to enable closed-loop heating the MEMS structure to a target frequency, control heating and/or quenching rates/profiles, etc.

After each heat-measure cycle, the parameters for the next cycle may be computed. This process may be aided by a model based approach, in which the expected frequency change for a thermal process is computed and compared with the measured frequency change. If the frequency change for a particular iteration is smaller in magnitude than the expected amount, the thermal power of the next iteration may be increased to compensate. Likewise, a larger than expected frequency change can be used to modify the thermal power of the next iteration. This feedback process can reduce the number of iterations, and hence the cost, of frequency trimming.

Figures 35, 36:
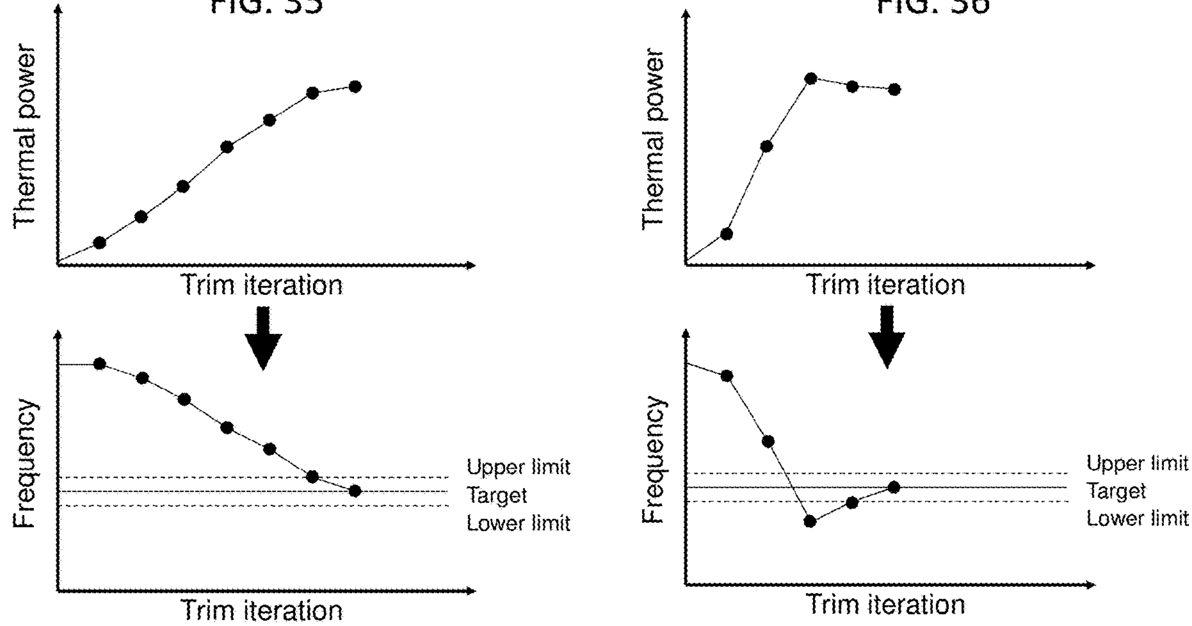

FIG. 35 illustrates an exemplary frequency trim procedure. At the start of each iteration, the resonant frequency is measured and the thermal process to apply is computed. The frequency is initially higher than the target frequency. The thermal power is initially small in order to avoid over adjusting the frequency and to potentially calibrate a mathematical model to the characteristics of this particular resonator. Over a total of seven iterations the thermal power is gradually increased and the frequency is gradually decreased until the target frequency is achieved. The frequency trim process may be terminated if the resonant frequency is within an acceptable range or alternatively aborted if the number of iterations is larger than a prescribed limit or the frequency is too far away from the target frequency for success to be likely.

FIG. 36 illustrates an exemplary frequency trim procedure that includes the technique of frequency backtuning. As noted earlier, the thermal frequency tuning of DDS may be reversible under certain circumstances. The capability to reverse the tuning process allows a more aggressive frequency trimming algorithm to be used. In this example, the thermal power is rapidly increased. After the third cycle, the resonant frequency is below the target frequency. The two remaining iterations reduce the thermal power to increase the frequency until the target frequency is achieved.

Multiple structures may be trimmed simultaneously to save time and reduce production costs. For instance, an electrical probe station may be constructed to measure and trim 2, or 4, or 8, or various other numbers of devices simultaneously. Alternately, or in combination, multiple structures may be electrically contacted simultaneously and trimmed sequentially.

The frequency tuning process may be used to simultaneously trim multiple system parameters and is not limited to the resonant frequency of a single resonant mode at room temperature. For example, the room temperature of multiple resonant modes may be adjusted, multiple temperature coefficients of a single mode, or any combination therein. This is possible by controlling the spatial distribution of the temperature across the MEMS structure during the thermal modification process. For example, consider two positions on the resonator, P1 and P2, and two vibrational modes, M1 and M2. The change in frequency of an individual eigenmode due to a change in stiffness at a particular position is proportional to the mechanical stress at that position. For example, the mechanical stress at P1 may be low for M1 and high for M2. The opposite may hold true for P2 with respect to M1 and M2. Thus, modifying the stiffness at P1 will preferentially modify the frequency of M1 while modifying the stiffness at P2 will preferentially modify the frequency of M2. The concept of a discrete position may be generalized to continuous temperature and stress distributions across the MEMS structure.

Example methods for controlling and varying the temperature distribution across the MEMS structure include varying the position of an incident laser beam, varying the selection of active and inactive electrical terminals used for heating, or varying the frequency of an alternating current input to vary the distribution of current that flows through the device, leading to a temperature increase, relative to the electrical current that passes through distributed parasitic capacitances.

Figures 37A, 37B, 37C, 37D:
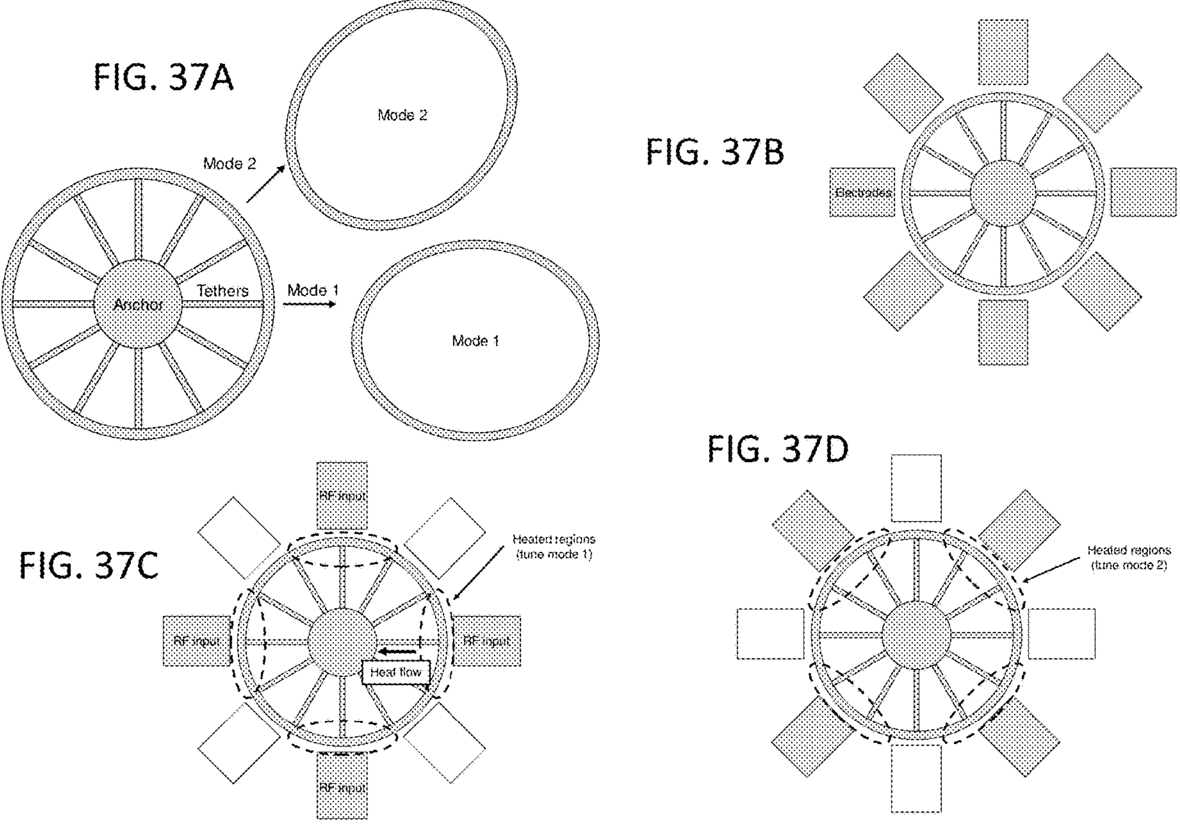
FIG. 37A illustrates a MEMS structure, a disk ring gyroscope in this particular example, with two vibrational modes of interest, mode 1 and mode 2.
FIG. 37B illustrates an array of electrodes surrounding the MEMS structure of FIG. 37A for utilization in capacitively coupled Joule heating in addition to potentially being used during normal device operation.
FIG. 37C illustrates a radio-frequency (RF) input applied to a subset of the electrodes such that the MEMS structure is non-uniformly heated to preferentially tune the frequency of mode 1 of the MEMS structure of FIG. 37A.
FIG. 37D illustrates an RF input applied to a different subset of the electrodes to preferentially adjust the frequency of mode 2 of the MEMS structure of FIG. 37A to obtain a desirable frequency relationship between the two modes.

FIGS. 37A-37D illustrate an exemplary manipulation of multiple resonant frequencies in a MEMS structure based upon heating with a subset of all available heating terminals. In FIG. 37A, a simplified disk ring gyroscope is illustrated with two vibrational modes of interest: mode 1 and mode 2. FIG. 37 illustrates an exemplary array of electrodes surrounding the MEMS structure for utilization in capacitively coupled Joule heating in addition to potentially being used during normal device operation. FIG. 37C illustrates an RF input applied to a subset of the electrodes such that the MEMS structure is nonuniformly heated to preferentially tune the frequency of mode 1, and FIG. 37D illustrates an RF input applied to a different subset of the electrodes to preferentially adjust the frequency of mode 2 to obtain a desirable frequency relationship between the two modes. Temperature-activated frequency trim can be utilized to manipulate the sum or product of two or more vibrational modes. Example applications include but are not limited to mode matching, engineering the frequency difference between two modes, and controlling the frequency ratio of two modes.

Figure 38:
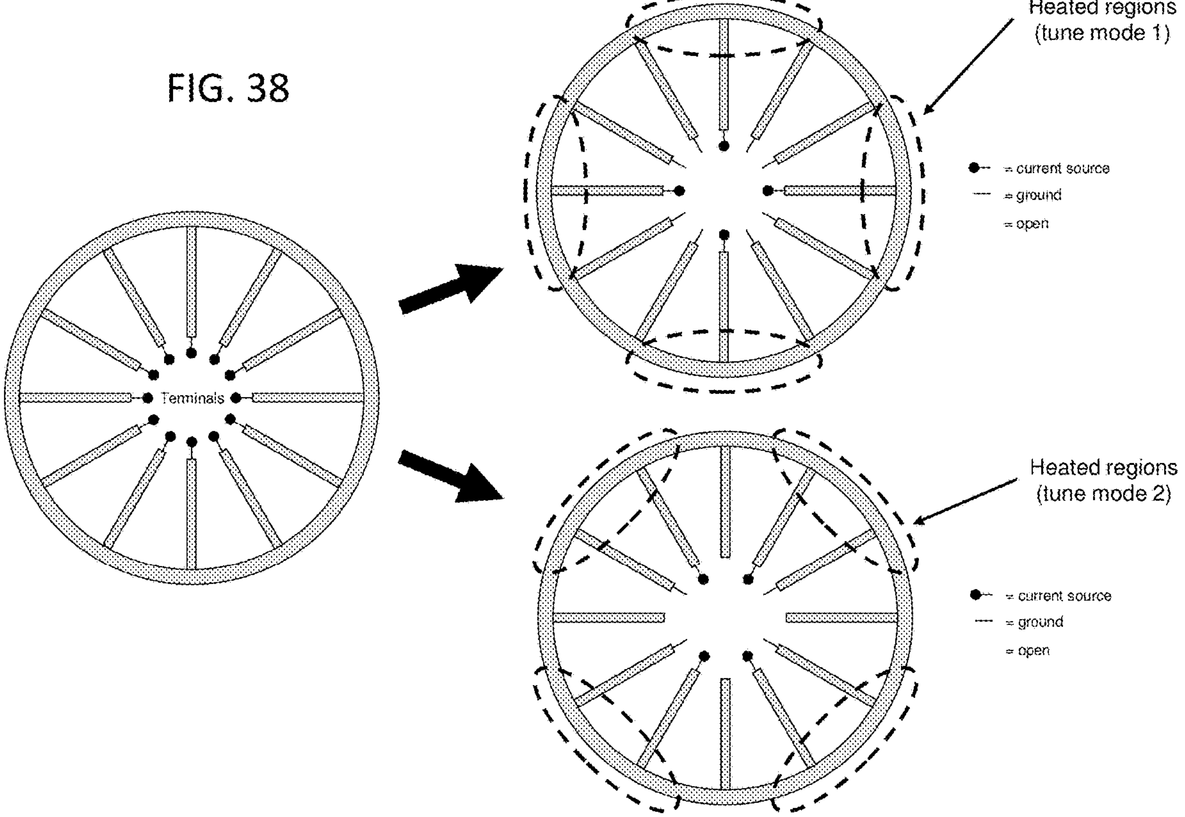

FIG. 38 illustrates the adjustment of the frequency relationship between two modes of a similar MEMS structure based upon the activation of a subset of heating terminals, except that the Joule heating is accomplished through terminals that are directly coupled to the structure, allowing the possibility of DC heating currents.

The DDS layer or the dopant concentration within the DDS layer may be varied across the MEMS structure. For example, regions with high electrical resistivity can be introduced into a structure to increase the local Joule heating power density. As another application, the variation in dopant concentration across the structure may allow the change in mechanical stiffness induced by superheating to be locally varied even if the temperature is relatively uniform across the structure. This can be utilized to engineer one or more temperature coefficients of frequency (TCFs) of the structure. For example, a MEMS resonator can be formed from two or more regions that are mechanically and thermally coupled but possess substantially different TCFs. The room temperature frequency and TCFs of the composite structure will depend on weighted contributions from each region. A change in the mechanical stiffness of one region with respect to the others will thus result in a change in the TCFs of the composite structure.

Asymmetrically altering the stiffness of the MEMS structure may also be used to induce a change in quality factor (Q) of the resonant device. By asymmetrically changing mass or stiffness of the resonator, increased energy loss will occur at the points where the resonator is connected to the substrate or the package. This will cause a reduction in Q. If the resonator is designed with an asymmetry and the laser alters the resonator to remove the asymmetry, the Q may increase. The level of the system Q may be calibrated by adjusting the spatial distribution of the temperature during thermal processing, for example through laser position or through the active electrical terminals.

The various circuits and MEMS structures disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits can be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image can thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any of the specific dimensions, quantities, temperatures, time periods, signal levels, power levels, signaling or operating frequencies, component circuits or devices and the like can be different from those described above in alternative embodiments. Additionally, links or other interconnection between integrated circuit devices or internal circuit elements or blocks may be shown as buses or as single signal lines. Each of the buses can alternatively be a single signal line, and each of the single signal lines can alternatively be buses. Signals and signaling links, however shown or described, can be single-ended or differential. A signal driving circuit is said to "output" a signal to a signal receiving circuit when the signal driving circuit asserts (or de-asserts, if explicitly stated or indicated by context) the signal on a signal line coupled between the signal driving and signal receiving circuits. The term "coupled" is used herein to express a direct connection as well as a connection through one or more intervening circuits or structures. Device "programming" can include, for example and without limitation, loading a control value into a register or other storage circuit within the integrated circuit device in response to a host instruction (and thus controlling an operational aspect of the device and/or establishing a device configuration) or through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The terms "exemplary" and "embodiment" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

What is claimed is:

1. A method comprising:

receiving an integrated circuit device having a microelectromechanical systems (MEMS) vibrating structure, a first external pin or contact, a second external pin or contact, a heating element, and circuitry, the MEMS vibrating structure characterized by a resonance frequency, the first external pin or contact to output a timing signal dependent on the resonance frequency, the integrated circuit device further having at least one structure having a material property that is changed under application of the heat, the resonance frequency being dependent on the material property, the second external pin or contact being adapted to cause the heating element to heat the at least one structure; and as part of a calibration operation for the integrated circuit device, measuring the timing signal to identify a deviation between the timing signal and a target value and, responsive to identification of the deviation, applying one or more electronic signals to the second external pin or contact to cause the heating element to heat the at least one structure in a manner that reduces the deviation such that, during run-time of the integrated circuit device, the at least one timing signal will be produced with the reduced deviation.

2. The method of claim 1 wherein the integrated circuit device is a packaged device having one or more dies, wherein each of the first external pin or contact are on an external surface of the packaged device, and wherein the MEMS vibrating structure is on a first die of the one or more dies.

3. The method of claim 1 wherein the at least one structure comprises one or more layers of the vibrating structure and wherein the heating element is adapted to heat the one or more layers via joule heating.

4. The method of claim 1 wherein the target value comprises a frequency of the timing signal at a predetermined operating temperature, and wherein measuring further comprises performing the measuring at the predetermined operating temperature.

5. The method of claim 4 wherein the integrated circuit device further comprises electronic storage and wherein the method further comprises:

identifying a temperature-dependent variation associated with the timing signal; and the method further comprises:

also measuring the frequency of the timing signal at a plurality of other temperatures, which are different than the predetermined temperature, and identifying respective deviations between the frequency of the timing signal and a predetermined resonance frequency at the other temperatures of the plurality;

calculating a correction polynomial dependent on the respective deviations; and programming into the electronic storage parameters which define the correction polynomial, such that the integrated circuit device thereby stores the correction polynomial, for application during run-time of the integrated circuit device.

6. The method of claim 5 wherein the integrated circuit device further comprises a temperature sensor and signal conditioning circuitry, the signal conditioning circuitry to, during run-time of the integrated circuit device, receive a sensed signal dependent on motion of the MEMS vibrating structure and to generate the timing signal dependent on the sensed signal, wherein the signal conditioning circuitry is configured to electronically correct the frequency of the timing signal on a basis that is internal to the integrated circuit device during run-time of the integrated circuit device, within an operating temperature range of the integrated circuit device, dependent on temperature sensed by the temperature sensor and dependent on the correction polynomial.

7. The method of claim 6 wherein the MEMS vibrating structure is part of a first MEMS resonator, wherein the temperature-dependent behavior is a first temperature-dependent behavior, wherein the temperature sensor comprises the first MEMS resonator and a second MEMS resonator, the second MEMS resonator having a second temperature-dependent behavior, and wherein the integrated circuit comprises circuitry operable to identify temperature sensed by the temperature sensor as a function of divergence in the second temperature-dependent behavior from the first temperature dependent behavior.

8. The method of claim 1 wherein the MEMS vibrating structure is a resonating structure which comprises at least a layer of crystal silicon, a conductive layer, and a piezoelectric layer, and wherein the method further comprises causing application of a drive signal to the conductive layer during the calibration operation, to cause the MEMS vibrating structure to vibrate dependent on the piezoelectric layer.

9. The method of claim 1 wherein the integrated circuit device is encapsulated, wherein the integrated circuit device further comprises the temperature sensor and third external pin or contact, wherein the method further comprises, during the calibration operation, receiving an indication of sensed temperature from within the encapsulated integrated circuit device, via the third external pin or contact, and wherein applying the one or more electronic signals includes selecting a signal dependent on the indication of sensed temperature and applying the selected signal.

10. The method of claim 1 wherein the one or more electronic signals comprise a pulsed signal having a frequency of at least one kilohertz.

11. The method of claim 1 wherein the method further comprises a bidirectional frequency tuning process and wherein the applying of the one or more electronic signals comprises selectively applying one of:

a first electronic signal to the second external pin or contact, to cause the heating element to heat the at least one structure in a manner that reduces a first one of positive deviation or negative deviation; and a second electronic signal to the second external pin or contact, to cause the heating element to heat the at least one structure in a manner that reduces a second one of positive deviation or negative deviation.

12. The method of claim 1 wherein receiving the integrated circuit device further comprises fabricating the MEMS vibrating structure using a semiconductor fabrication process.

13. A method comprising:

receiving an integrated circuit device having:

a first die having a microelectromechanical systems (MEMS) vibrating structure;

a second die having circuitry;

a first external pin or contact; and a second external pin; and wherein:

the integrated circuit device further has a heating element;

the MEMS vibrating structure is characterized by a resonance frequency;

the first external pin or contact is to output a timing signal dependent on the resonance frequency;

the integrated circuit device further has at least one structure having a material property that is changed under application of the heat;

the resonance frequency is dependent on the material property; and the second external pin or contact is adapted to cause the heating element to heat the at least one structure; and as part of a calibration operation for the integrated circuit device, measuring the timing signal to identify a deviation between the timing signal and a target value and, responsive to identification of the deviation, applying one or more electronic signals to the second external pin or contact to cause the heating element to heat the at least one structure in a manner that reduces the deviation such that, during run-time of the integrated circuit device, the at least one timing signal will be produced with the reduced deviation.

14. The method of claim 13 wherein the integrated circuit device is an encapsulated device, wherein each of the first external pin or contact are on an external surface of the encapsulated device, and wherein measuring is performed by electrical coupling the first external pin or contact to a recipient device, the measuring thereby being performed notwithstanding the presence of the encapsulation.

15. The method of claim 13 wherein the at least one structure comprises one or more layers of the vibrating structure and wherein applying comprises applying at least a one kilohertz signal to the second electrical contact to cause the heating element to heat the one or more layers via joule heating.

16. The method of claim 13 wherein:

the target value comprises a frequency of the timing signal at a predetermined operating temperature, and wherein measuring further comprises performing the measuring at the predetermined operating temperature;

the integrated circuit device further comprises electronic storage; and the method further comprises:

also measuring the frequency of the timing signal at a plurality of other temperatures, which are different than the predetermined temperature, and identifying respective deviations between the frequency of the timing signal and a predetermined resonance frequency at the other temperatures of the plurality;

calculating a correction polynomial dependent on the respective deviations; and programming into the electronic storage parameters which define the correction polynomial, such that the integrated circuit device thereby stores the correction polynomial, for application during run-time of the integrated circuit device.

17. The method of claim 16 wherein the integrated circuit device is configured such that the correction polynomial is internally applied by the integrate circuit device, and wherein the integrated circuit device is configured such that, during run-time, the first external pin or contact will output a temperature-corrected timing signal.

18. The method of claim 13 wherein the MEMS vibrating structure is a resonating structure which comprises at least a layer of crystal silicon, a conductive layer, and a piezoelectric layer, and wherein the method further comprises causing application of a drive signal to the conductive layer during the calibration operation, to cause the MEMS vibrating structure to vibrate dependent on the piezoelectric layer.

19. The method of claim 13 wherein the method further comprises a bidirectional frequency tuning process and wherein the applying of the one or more electronic signals comprises selectively applying one of:

a first electronic signal to the second external pin or contact, to cause the heating element to heat the at least one structure in a manner that reduces a first one of positive deviation or negative deviation; and a second electronic signal to the second external pin or contact, to cause the heating element to heat the at least one structure in a manner that reduces a second one of positive deviation or negative deviation.

20. A method comprising:

fabricating an integrated circuit device having a microelectromechanical systems (MEMS) structure, a storage device, a heating element and circuitry, the MEMS structure characterized by a temperature-dependent behavior, the circuitry being adapted to generate an electronic signal dependent on movement or deflection of the MEMS structure during run-time of the integrated circuit device;

as part of a calibration operation for the integrated circuit device, causing the heating element to heat the structure to a plurality of different temperatures and, for each of the different temperatures in the plurality, identifying deviation of a property conveyed the electronic signal from a desired value;

calculating a correction polynomial dependent on the identified deviations; and programming into the storage device parameters which define the correction polynomial, such that the integrated circuit device thereby stores the correction polynomial, for application during run-time of the integrated circuit device, to electronically correct the electronic signal, within an operating temperature range of the integrated circuit device.

* * * * *